United States Patent
Nendai et al.

(10) Patent No.: US 10,680,047 B2
(45) Date of Patent: Jun. 9, 2020

(54) ORGANIC EL DISPLAY PANEL, ORGANIC EL DISPLAY DEVICE, AND METHOD OF MANUFACTURING ORGANIC EL DISPLAY PANEL

(71) Applicant: JOLED INC., Tokyo (JP)

(72) Inventors: Kenichi Nendai, Tokyo (JP); Noriteru Maeda, Tokyo (JP); Kenta Fukuoka, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/257,071

(22) Filed: Jan. 25, 2019

(65) Prior Publication Data

US 2019/0371872 A1 Dec. 5, 2019

(30) Foreign Application Priority Data

May 30, 2018 (JP) .................. 2018-103865

(51) Int. Cl.
*H01L 27/32* (2006.01)
*H01L 51/52* (2006.01)
(Continued)

(52) U.S. Cl.
CPC ............ *H01L 27/326* (2013.01); *H01L 27/32* (2013.01); *H01L 27/322* (2013.01); *H01L 27/3211* (2013.01); *H01L 27/3246* (2013.01); *H01L 27/3283* (2013.01); *H01L 51/0005* (2013.01); *H01L 51/5012* (2013.01);
(Continued)

(58) Field of Classification Search
CPC ..... H01L 51/50; H01L 51/52; H01L 51/5203; H01L 51/5209; H01L 51/5225; H01L 27/32; H01L 27/3258; H01L 27/326; H01L 27/3283; H01L 27/3295
See application file for complete search history.

(56) References Cited

U.S. PATENT DOCUMENTS

2007/0132356 A1* 6/2007 Hashimoto ......... H01L 27/3283
313/292
2013/0214301 A1 8/2013 Yamada et al.
(Continued)

FOREIGN PATENT DOCUMENTS

JP 2013-191533 A 9/2013
JP 2013-240733 A 12/2013

*Primary Examiner* — Eduardo A Rodela
(74) *Attorney, Agent, or Firm* — Hauptman Ham, LLP

(57) ABSTRACT

An organic EL display panel including pixels arranged in a matrix includes: a substrate; pixel electrodes arranged above the substrate in the matrix; an insulating layer provided above the pixel electrodes and having openings for each pixel electrode; banks extending in a column direction and partitioning between the pixel electrodes in a row direction; organic functional layers provided above the pixel electrodes and including organic light emitting layers where organic electroluminescence occurs in the openings; and a light-transmissive counter electrode provided above the functional layers. The openings include: first openings arranged in line in the column direction; and a second opening adjacent to one of the first openings in the row direction. Portions of the insulating layer between the first openings adjacent in the column direction are lower in height relative to the pixel electrode than a portion of the insulating layer between the first opening and the second opening.

10 Claims, 19 Drawing Sheets

(51) Int. Cl.
*H01L 51/00* (2006.01)
*H01L 51/50* (2006.01)

(52) U.S. Cl.
CPC ...... *H01L 51/5056* (2013.01); *H01L 51/5072* (2013.01); *H01L 51/5088* (2013.01); *H01L 51/52* (2013.01); *H01L 51/5203* (2013.01); *H01L 51/5218* (2013.01); *H01L 51/5234* (2013.01); *H01L 51/5271* (2013.01); *H01L 2227/323* (2013.01)

(56) References Cited

U.S. PATENT DOCUMENTS

2016/0293681 A1* 10/2016 Shinokawa ......... H01L 27/3211
2016/0351637 A1* 12/2016 Hashimoto ......... H01L 51/5092
2017/0213881 A1*  7/2017 Kondo ............... H01L 51/5228
2017/0287993 A1* 10/2017 Takata ............... H01L 27/3211
2019/0341576 A1* 11/2019 Ochi .................. H05B 33/22

\* cited by examiner

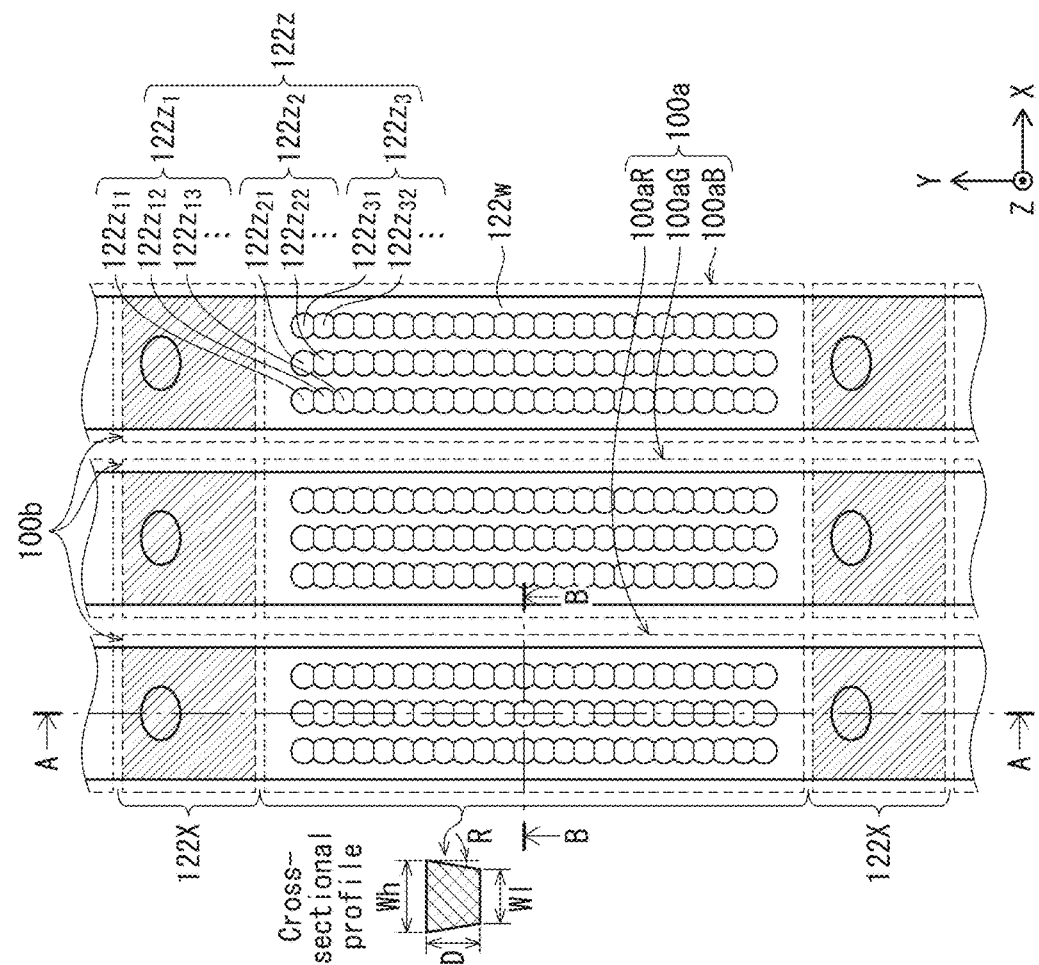
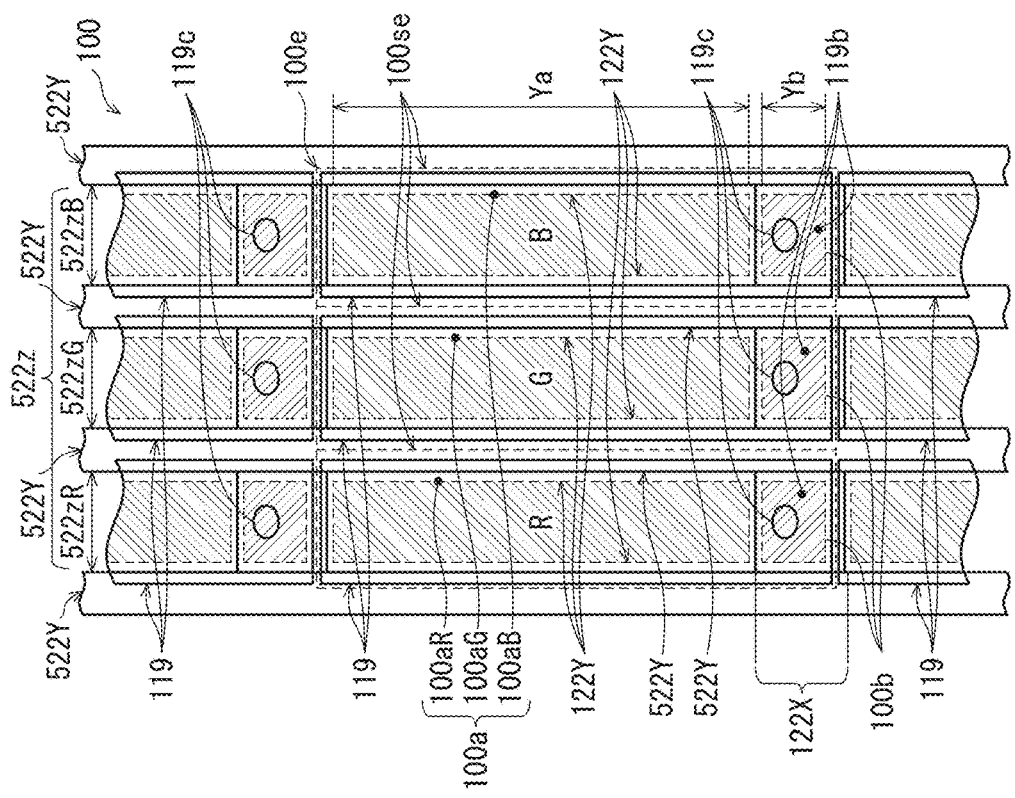

FIG. 17A
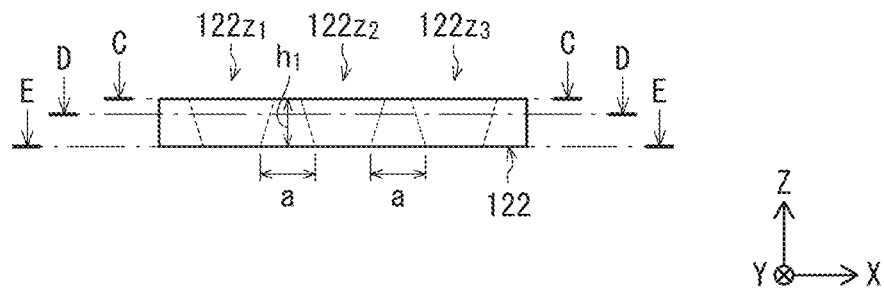
FIG. 17B
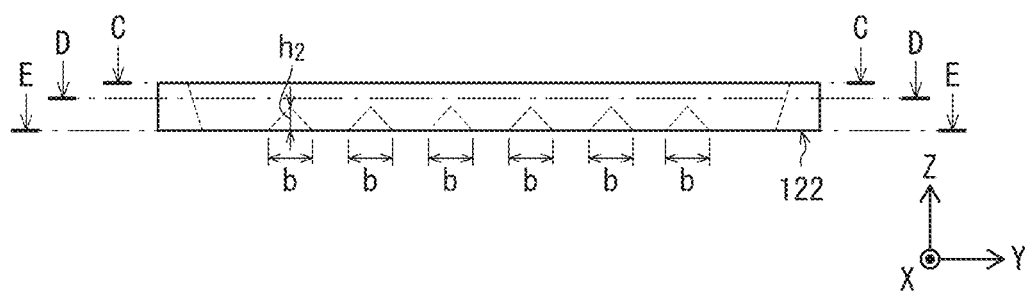
FIG. 17C    FIG. 17D    FIG. 17E
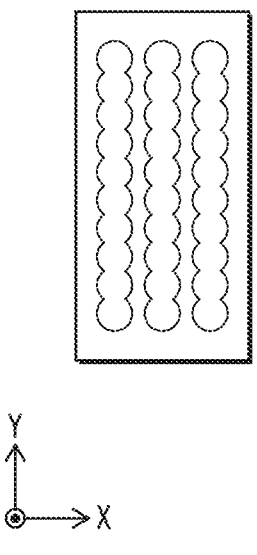  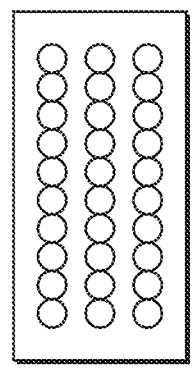  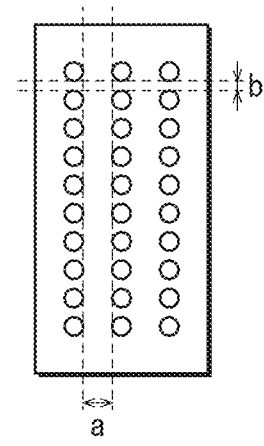

FIG. 18
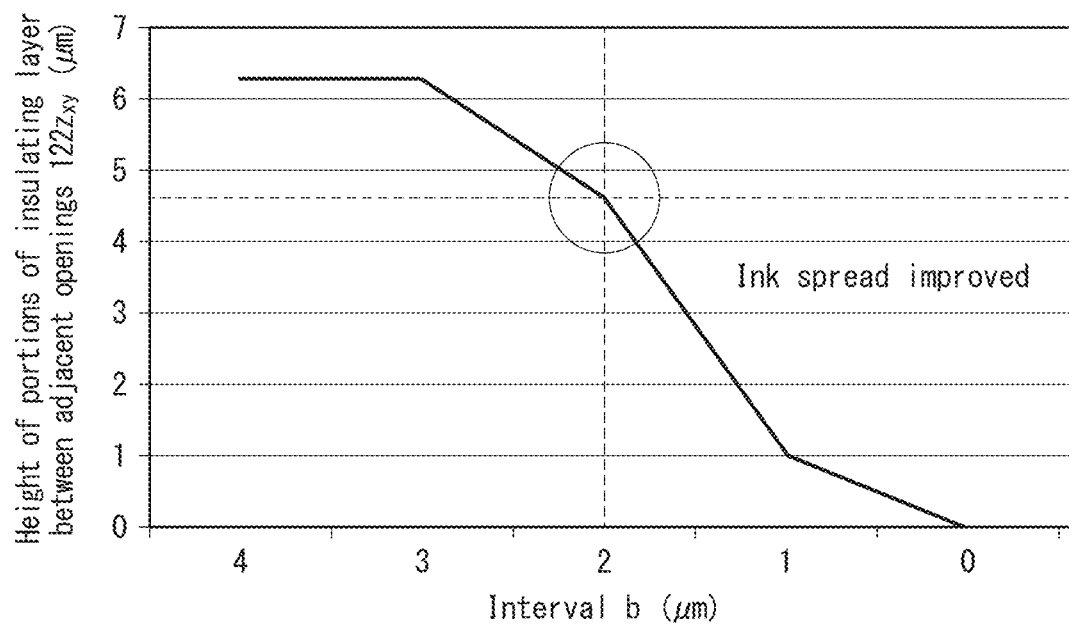

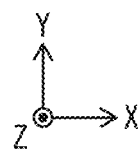
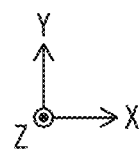
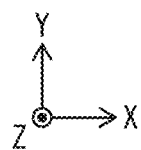

_US 10,680,047 B2_

ORGANIC EL DISPLAY PANEL, ORGANIC EL DISPLAY DEVICE, AND METHOD OF MANUFACTURING ORGANIC EL DISPLAY PANEL

This application claims priority to Japanese Patent Application No. 2018-103865, filed May 30, 2018, the contents of which are hereby incorporated by reference in their entirety.

BACKGROUND OF DISCLOSURE

Technical Field

The present disclosure relates to organic electroluminescence (EL) display panels that use organic EL elements employing electroluminescence of organic material, organic EL display devices using the organic EL display panels, and a method of manufacturing the organic EL display panels.

Description of the Related Art

In recent years, lighting devices and organic EL display devices using organic EL elements as light emitting elements have become increasingly widespread. Further, there has been a demand for development in efficient light extraction art for such organic EL display devices. This is because an improvement in light extraction efficiency enables an effective use of light emission amount of organic EL elements, thereby contributing to power saving and service life prolonging.

One of methods of improving the light extraction efficiency is to provide organic EL display devices with reflectors (reflective structure), such as described in Japanese Patent Application Publication No. 2013-191533.

Meanwhile, one of methods of efficiently forming functional layers is to apply an ink containing functional materials with a wet process such as an ink jet method, such as described in Japanese Patent Application Publication No. 2013-240733. In such functional layer formation with the wet process, the positional accuracy for layer formation does not depend on the substrate size. For this reason, the wet process is suitable for large-sized panel manufacturing and efficient panel manufacturing by cutting from large-sized substrates.

SUMMARY

The present disclosure includes an organic EL display panel that exhibits an improved ink spread while maintaining a high reflector function for a high light extraction efficiency, thereby maintaining high luminous efficiency and panel service life.

An organic EL display panel relating to at least one aspect of the present disclosure is an organic EL display panel including pixels arranged in a matrix of rows and columns. The organic EL display panel includes: a substrate; pixel electrodes that are arranged above the substrate in the matrix; an insulating layer that is provided above the pixel electrodes and has a plurality of openings for each of the pixel electrodes; banks that extend in a column direction and partition between the pixel electrodes in a row direction; organic functional layers that are provided above the pixel electrodes and include organic light emitting layers in which organic electroluminescence occurs in the plurality of openings; and a light-transmissive counter electrode that is provided above the organic functional layers. The plurality of openings include first openings and a second opening. The first openings are arranged in line in the column direction to form a first opening line, and the second opening is adjacent to one of the first openings in the row direction. Portions of the insulating layer between the first openings adjacent to each other in the column direction are lower in terms of height relative to the pixel electrode than a portion of the insulating layer between the one first opening and the second opening.

According to the organic EL display panel relating to at least one aspect of the present, an ink can flow between the first openings arranged in the column direction, and thus the ink spread in each pixel is improved. Accordingly, it is possible to form functional layers having a uniform film thickness in each pixel, thereby improving the luminous efficiency and the panel service life. Also, the reflector function is sufficiently fulfilled by the portion of the insulating layer between the one first opening and the second opening adjacent to each other in the row direction. Further, the reflector function is also maintained by the portions of the insulating layer between the first openings adjacent to each other in the column direction. This suppresses deterioration in light extraction efficiency.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIGS. 4A and 4B are enlarged plan views of a portion X1 in FIG. 3, where FIG. 4A shows one pixel 100 of the organic EL display panel 10, and FIG. 4B shows subpixels 100$a$ constituting the pixel 100.

FIG. 8A shows a formation process of a substrate 100$x$, FIG. 8B shows a formation process of passivation layers 116, FIG. 8C shows a formation process of contact holes 116$a$, FIG. 8D shows a formation process of an interlayer insulating layer 118, and FIG. 8E shows a formation process of pixel electrode layers 119.

FIGS. 9A to 9C show a formation process of an insulating layer 122, and FIG. 9D shows a formation process of column banks 522Y.

FIG. 10A shows a formation process of a hole injection layer 120 and a hole transport layer 121, FIG. 10B shows a formation process of light emitting layers 123, and FIG. 10C shows a formation process of an electron transport layer 124, a counter electrode layer 125, and a sealing layer 126.

FIG. 11A shows a formation process of a bond layer 127 and FIG. 11B shows a bond process of a CF substrate 131.

FIG. 13A shows the formation process of the hole injection layer 120 and the hole transport layer 121, FIGS. 13B and 13C show the formation process of the light emitting layers 123, and FIG. 13D shows the formation process of the electron transport layer 124, the counter electrode layer 125, and the sealing layer 126.

FIG. 14A shows the formation process of the bond layer 127 and FIG. 14B shows the bond process of the CF substrate 131.

FIG. 15A shows application for lattice-shaped banks, and FIG. 15B show application for line-shaped banks.

FIGS. 17A to 17E are schematic cross-sectional views of the insulating layer 122, where FIG. 17A is taken along the line at the same position as the line A-A in FIG. 4B, FIG. 17B is taken along the line at the same position as the line B-B in FIG. 4B, and FIG. 17C is taken along a line at the same position as a line C-C in FIGS. 17A and 17B, FIG. 17D is taken along a line at the same position as a line D-D in FIGS. 17A and 17B, and FIG. 17E is taken along a line at the same position as a line E-E in FIGS. 17A and 17B.

FIG. 18 is a graph showing, with respect to openings of the insulating layer 122 that are arranged in a matrix and have a lower width of 4.5 µm, a relationship between a distance between respective lower surfaces of the openings adjacent to each other in a column direction and a height of the lowest portions of the insulating layer 122 that partition between the openings.

FIG. 19A is taken along the line at the same position as the line C-C in FIGS. 17A and 17B, FIG. 19B is taken along the line at the same position as the line E-E in FIGS. 17A and 17B, and FIG. 19C is taken along the line at the same position as the line C-C in FIGS. 17A and 17B.

DETAILED DESCRIPTION

<<Process by which One Aspect of the Present Disclosure was Achieved>>

To improve the light extraction efficiency, organic EL display devices are provided with reflectors (reflective structure) such as described in Japanese Patent Application Publication No. 2013-191533. According to such an organic EL display panel of Japanese Patent Application Publication No. 2013-191533, subpixels constituting pixels each have one reflector. To further improve effects of the reflectors, the study has been promoted on a configuration in which such subpixels each have a plurality of reflectors. In this reflector configuration, a plurality of micropixels each having one reflector are formed in each subpixel that includes a pixel inner insulating layer sandwiched between a pixel electrode and a functional layer.

Meanwhile, layer formation with the wet process has been performed for functional layers such as light emitting layers, carrier injection layers, and carrier transport layers, especially with respect to large-sized panels, as described for example in Japanese Patent Application Publication No. 2013-240733. However, such functional layer formation with the wet process requires a uniform ink spread over the entire subpixels. Unfortunately, in the case where the wet process is used for forming functional layers above a surface having a plurality of depressions, for example above an upper surface of a pixel inner insulating layer, an ink containing functional layer materials is hindered from spreading by the upper surface of the pixel inner insulating layer. In particular, as the depressions are smaller, the ink spread is more insufficient.

Figure 20A:
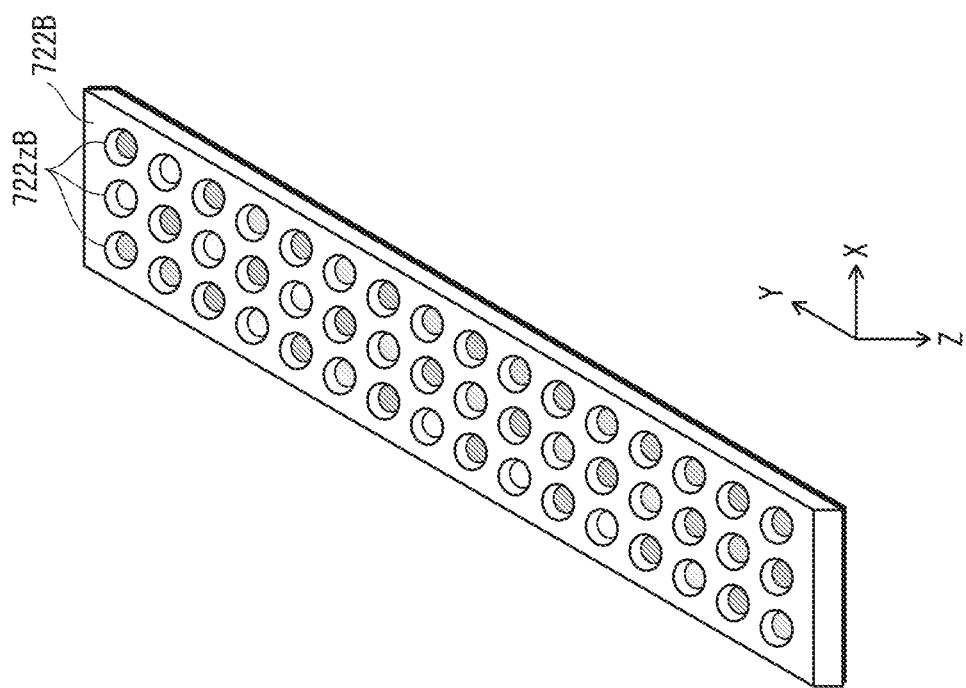
FIGS. 20A and 20B are schematic appearance views of insulating layers as comparative examples.

One of methods of improving the ink spread is to arrange a plurality of elongated depressions. As a specific configuration for the ink spread improvement, in FIG. 20A, a pixel inner insulating layer 722A has a plurality of depressions 722zA that extend in the column direction and are arranged in the row direction in plan view. This configuration enables the ink to flow in the column direction to improve the ink spread. The ink spread is further improved especially for so-called line-shaped banks, in particular, liquid-repellant banks that partition between subpixels and extend in the column direction. This is because, according to the line-shaped banks, droplets of an ink that are ejected at intervals in the column direction flow in the column direction. Thus, the ink spread is further improved by coinciding a bank extending direction with an opening extending direction in the line-shaped banks.

However, according to such depressions of the pixel inner insulating layer, which are elongated and extend in the column direction, an area of side surfaces of the depressions functioning as reflectors is small relative to an area of lower surfaces of the depressions functioning as luminous regions. Specifically, the area of the reflective surfaces especially in the column direction is small relative to the area of the luminous regions. Thus, the light extraction efficiency by the reflectors in the column direction is insufficiently improved relative to that in the row direction. This causes a problem for entire panel that the light extraction efficiency by the reflectors is insufficiently improved.

Figure 20B:
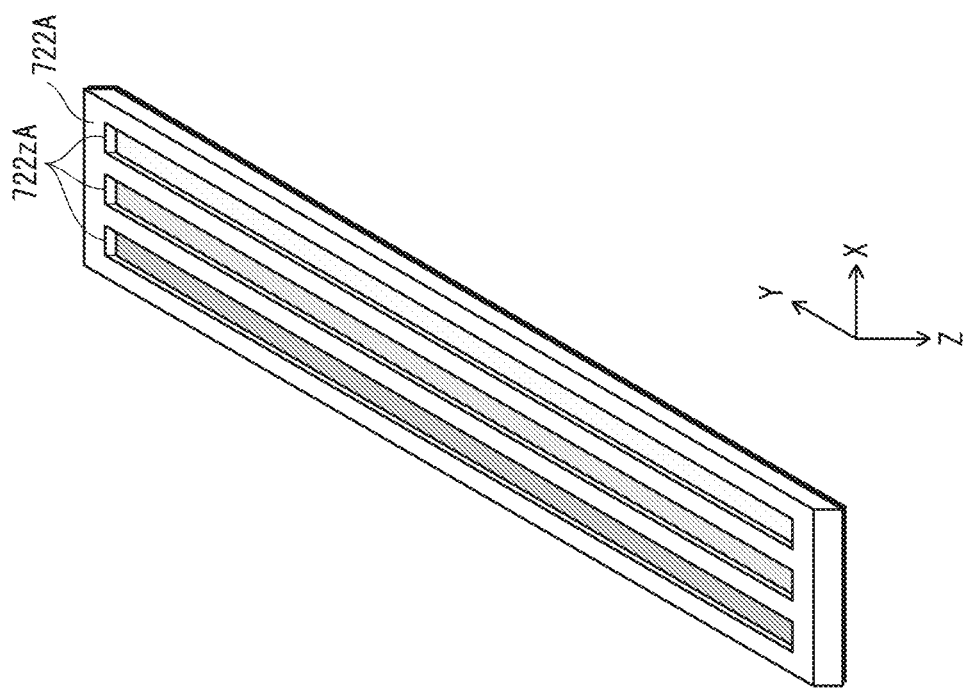

The light extraction efficiency by the reflectors increases as the area of the reflective surfaces increases relative to the area of the luminous regions and as the reflectors are isotropic relative to the column direction and the row direction. That is, to improve the light extraction efficiency, the depressions that are to be micropixels need to be small in size, large in number, and isotropic relative to directions parallel to a plane. As a specific configuration for the ink spread improvement, in FIG. 20B, a pixel inner insulating layer 722B has a plurality of truncated conical depressions 722zB that are arranged in a matrix in plan view. However, this configuration exhibits an insufficient ink spread as described above, and thus tends to cause an insufficient formation and a nonuniform film thickness of functional layers especially in the column direction. In view of this problem, the inventors earnestly considered an organic EL display panel in which a high light extraction efficiency is exhibited by reflectors and an improved ink spread is exhibited. As a result, the inventors conceived of the present disclosure.

<<Aspects of the Present Disclosure>>

An organic EL display panel relating to at least one aspect of the present disclosure is an organic EL display panel including pixels arranged in a matrix of rows and columns. The organic EL display panel includes: a substrate; pixel electrodes that are arranged above the substrate in the matrix; an insulating layer that is provided above the pixel electrodes and has a plurality of openings for each of the pixel electrodes; banks that extend in a column direction and partition between the pixel electrodes in a row direction; organic functional layers that are provided above the pixel electrodes and include organic light emitting layers in which organic electroluminescence occurs in the plurality of openings; and a light-transmissive counter electrode that is provided above the organic functional layers. The plurality of openings include first openings and a second opening. The first openings are arranged in line in the column direction to form a first opening line, and the second opening is adjacent to one of the first openings in the row direction. Portions of the insulating layer between the first openings adjacent to each other in the column direction are lower in terms of height relative to the pixel electrode than a portion of the insulating layer between the one first opening and the second opening.

According to the organic EL display panel relating to at least one aspect of the present, inks can flow between the first openings arranged in the column direction, and thus the ink spread in each pixel is improved. Accordingly, it is possible to form functional layers having a uniform film thickness in each pixel, thereby improving the luminous efficiency and the panel service life. Also, the reflector function is sufficiently fulfilled by the portion of the insulating layer between the one first opening and the second opening adjacent to each other in the row direction. Further, the reflector function is also maintained by the portions of the insulating layer between the first openings adjacent to each other in the column direction. This suppresses deterioration in light extraction efficiency.

Also, according to an organic EL display panel relating to at least one aspect of the present disclosure, the plurality of openings each may have a width increasing toward the counter electrode and have a slope toward a periphery of the pixel.

The above aspect enables the slope to function as reflective surfaces of reflectors, thereby improving the light extraction efficiency.

Also, according to an organic EL display panel relating to at least one aspect of the present disclosure, the portions of the insulating layer between the first openings adjacent to each other in the column direction may be 75% or less of the portion of the insulating layer between the one first opening and the second opening in terms of the height relative to the pixel electrode.

This aspect enables inks to flow between the first openings arranged in the column direction, thereby improving the ink spread in each pixel. Thus, it is possible to form functional layers having a uniform film thickness in each pixel, thereby improving the luminous efficiency and the panel service life.

Also, according to an organic EL display panel relating to at least one aspect of the present disclosure, the portion of the insulating layer between the one first opening and the second opening may have a height of 6 μm or more relative to the pixel electrode.

This aspect enables the reflective surfaces of the reflectors to have a sufficient area, thereby sufficiently improving the light extraction efficiency.

Also, according to an organic EL display panel relating to at least one aspect of the present disclosure, the second opening may be plural in number, and the second openings may be arranged in line in the column direction to form a second opening line that is adjacent to the first opening line in the row direction. In a lower surface of the insulating layer, a distance between the first openings adjacent to each other in the column direction may be shorter than a distance between the first opening line and the second opening line.

This aspect easily achieves the present embodiment by arranging a plurality of openings in a matrix and setting a distance between the openings adjacent to each other in the column direction shorter than a distance between the openings adjacent to each other in the row direction.

Also, according to an organic EL display panel relating to at least one aspect of the present disclosure, in the lower surface of the insulating layer, the distance between the first openings adjacent to each other in the column direction may be shorter than 0.65 times a width of each of the first openings in the column direction.

This aspect enables inks to flow in the column direction, thereby suppressing an insufficient ink spread and nonuniformity in film thickness in the column direction.

Also, according to an organic EL display panel relating to at least one aspect of the present disclosure, the first openings each may be a truncated cone whose diameter decreases toward the pixel electrode.

This aspect maximizes the light extraction efficiency.

Also, according to an organic EL display panel relating to at least one aspect of the present disclosure, the second opening may be elongated and extend in the column direction.

This aspect enables the second opening to assist the ink spread, thereby improving the ink spread with no need of excessively reducing the height of the portions of the insulating layer between the first openings adjacent to each other in the column direction.

An organic EL display device relating to at least one aspect of the present disclosure is an organic EL display device comprising the organic EL display panel relating to at least one aspect of the present disclosure.

A method of manufacturing an organic EL display panel relating to at least one aspect of the present disclosure is a method of manufacturing an organic EL display panel including pixels arranged in a matrix of rows and columns. The method includes: preparing a substrate; forming pixel electrodes above the substrate in the matrix; forming, above the pixel electrodes, an insulating layer having a plurality of openings for each of the pixel electrodes; forming banks extending in a column direction and partitioning between the pixel electrodes in a row direction; forming, in the plurality of openings, organic functional layers including organic light emitting layers by applying an ink while scanning at least one of the substrate and an application device in the row direction, the ink containing a material of the organic light emitting layers; and forming a light-transmissive counter electrode above the organic functional layers. In the forming of the insulating layer, the plurality of openings including first openings and a second opening are provided in the insulating layer such that: the first openings are arranged in line in the column direction to form a first opening line; the second opening is adjacent to one of the first openings in the row direction; and portions of the insulating layer between the first openings adjacent to each other in the column direction are lower in terms of height relative to the pixel electrode than a portion of the insulating layer between the one first opening and the second opening.

This configuration enables manufacturing of an organic EL display panel relating to at least one aspect of the present disclosure.

<<At Least One Embodiment>>

1 Circuit Configuration 1.1 Circuit Configuration of Display Device 1

The following describes circuit configuration of an organic EL display device 1 (hereinafter referred to just as display device 1) relating to at least one embodiment, with reference to FIG. 1.

Figure 1:
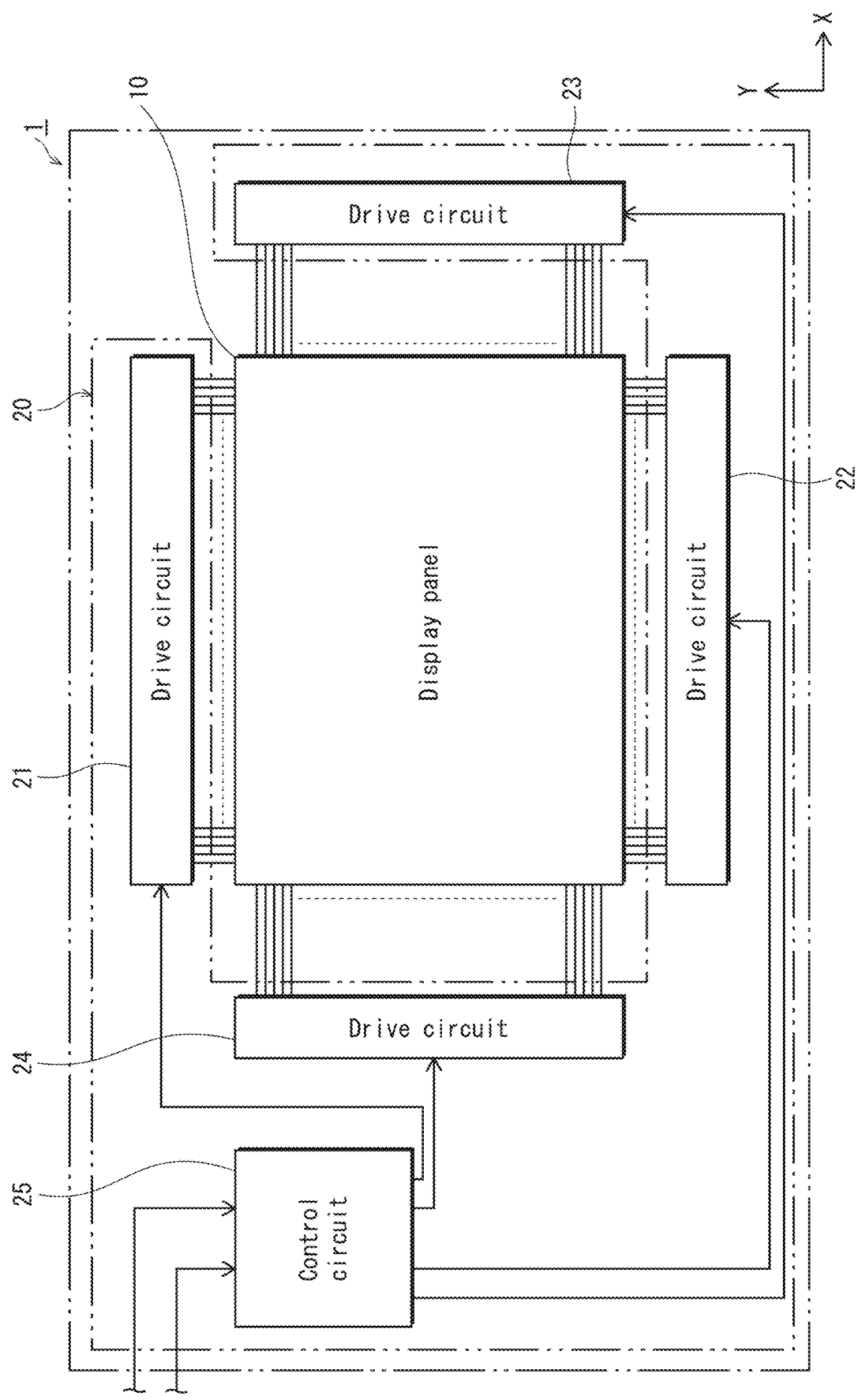
FIG. 1 is a schematic block diagram of circuit configuration of an organic EL display device 1 relating to at least one aspect.

In FIG. 1, the display device 1 includes an organic EL display panel 10 (hereinafter referred to just as display panel 10) and a drive control circuit unit 20 connected thereto.

The display panel 10 is an organic EL panel that makes use of electroluminescence of organic material, in which organic EL elements are arranged in a matrix, for example. The drive control circuit unit 20 includes four drive circuits 21-24 and a control circuit 25.

The arrangement of the circuits of the drive control circuit unit 20 with respect to the display panel 10 in the display device 1 is not limited to the configuration shown in FIG. 1.

1.2 Circuit Configuration of Display Panel 10

The display panel 10 includes a plurality organic EL elements that are composed of three-color subpixels (not shown) emitting light of red (R), green (G), and blue (B) colors. Circuit configuration of the subpixels 100*se* is described with reference to FIG. 2.

Figure 2:
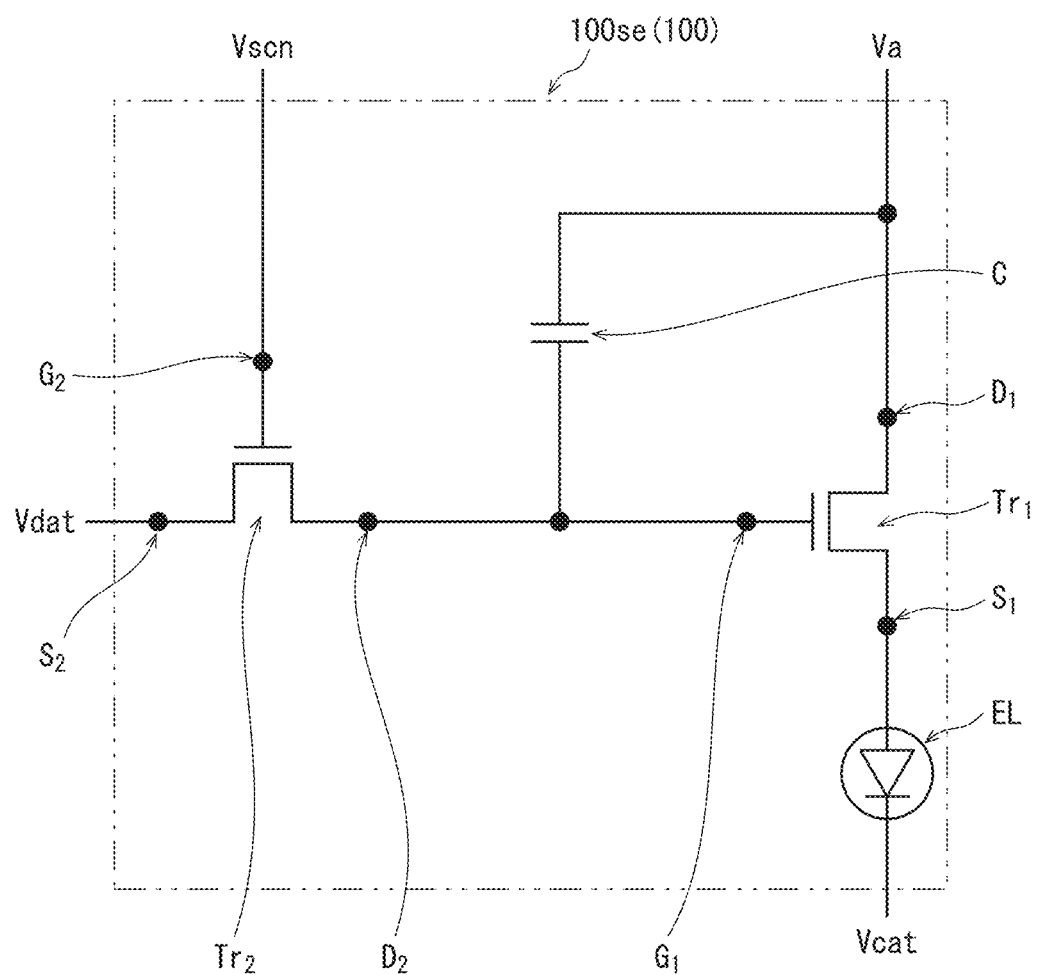
FIG. 2 is a schematic circuit diagram of circuit configuration of each subpixel 100$se$ of an organic EL display panel 10 used in the organic EL display device 1 relating to at least one aspect.

FIG. 2 is a schematic circuit diagram showing the circuit configuration of an organic EL element 100 corresponding to the subpixels 100*se* of the display panel 10 used in the display device 1. The organic EL display elements 100 constituting the unit pixels 100*e* are arranged in a matrix as a display region of the display panel 10.

In the display panel 10 relating to the present embodiment, in FIG. 2, each subpixel 100*se* includes two transistors $Tr_1$ and $Tr_2$, a single capacitance C, and an organic EL element unit EL as a light emitting unit. The transistor $Tr_1$ is a drive transistor, and the transistor $Tr_2$ is a switching transistor.

A gate $G_2$ and a source $S_2$ of the switching transistor $Tr_2$ are respectively connected to a scanning line Vscn and a data line Vdat. A drain $D_2$ of the switching transistor $Tr_2$ is connected to a gate $G_1$ of the drive transistor $Tr_1$.

A drain $D_1$ and a source $S_1$ of the drive transistor $Tr_1$ are respectively connected to a power line Va and a pixel electrode layer (anode) of the organic EL element unit EL. A counter electrode layer (cathode) of the organic EL element unit EL is connected to a ground line Vcat.

Note that the capacitance C is provided so as to connect between the drain $D_2$ of the switching transistor $Tr_2$ and the power line Va and connect between the gate $G_1$ of the drive transistor $Tr_1$ and the power line Va.

In the display panel 10, one unit pixel 100*e* is composed of a combination of adjacent subpixels 100*se* (for example, three subpixels 100*se* of R, G, and B luminescent colors), and a pixel region is composed of the subpixels 100*se* that are distributed. A gate line GL is extracted from the gate $G_2$ of each subpixel 100*se*, and is connected to the scanning line Vscn that is connected to the outside of the display panel 10. Similarly, a source line SL is extracted from the source $S_2$ of each subpixel 100*se*, and is connected to the data line Vdat that is connected to the outside of the display panel 10.

Furthermore, the power line Va and the ground line Vcat of each subpixel 100*se* are collectively connected to the power line Va and the ground line Vcat.

3. Overall Configuration of Organic EL Display Panel 10

The following describes the display panel 10 relating to the present embodiment with reference to the drawings. Note that the drawings are pattern diagrams and are not necessarily drawn to scale.

Figure 3:
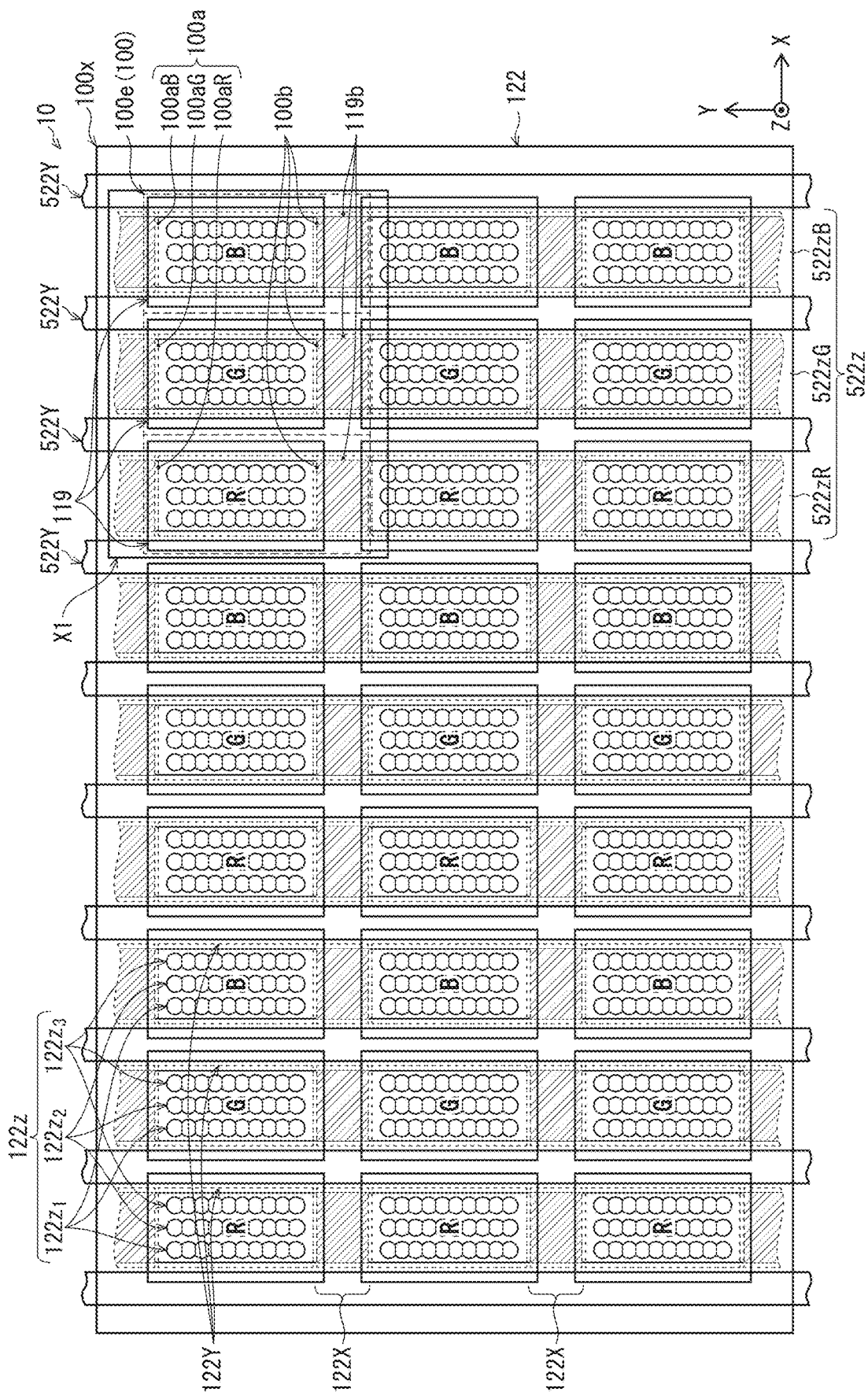
FIG. 3 is a schematic plan view of part of the organic EL display panel 10 relating to at least one aspect.

FIG. 3 is a schematic plan view of part of the display panel 10 relating to the present embodiment. FIG. 4A is an enlarged plan view of a portion X1 in FIG. 3 indicating one pixel 100 of the display panel 10. FIG. 4B is an enlarged plan view of subpixels 100*a* of the pixel 100.

The display panel 10 is an organic EL display panel that makes use of electroluminescence of organic compound. In the display panel 10, the organic EL elements 100 each constituting a pixel are arranged in a matrix on a substrate 100*x* (thin film transistor (TFT) substrate) on which TFTs are formed. The display panel 10 is of the top-emission type and emits light from an upper surface thereof. In FIG. 3, the display panel 10 includes the organic EL elements 100, constituting the pixels, arranged in a matrix. Here, the X-direction, the Y-direction, and the Z-direction in FIG. 3 are respectively referred to as the row direction, the column direction, and the thickness direction in the display panel 10 in the present specification.

In FIG. 3, the display panel 10 includes pixel electrode layers 119 that are arranged on the substrate 100*x* in a matrix, and includes an insulating layer 122 that covers the pixel electrode layers 119.

In the case where the insulating layer 122 has an upper limit film thickness of 10 μm or less, it is possible to perform shape control at the manufacturing in terms of variation in film thickness and control on bottom line thickness. Furthermore, in the case where the insulating layer 122 has an upper limit film thickness of 7 μm or less, it is possible to suppress an increase in operation process caused by an increase in exposure period during the exposure process, thereby to suppress a decrease in productivity during the mass production process. Also, the insulating layer 122 needs to have the film thickness and the bottom line thickness such that as the film thickness decreases, a difference therebetween decreases to substantially zero. The lower limit film thickness of the insulating layer 122 is determined in accordance with the resolution limit of materials and exposure machines. The insulating layer 122 having a lower limit film thickness of 1 μm or more can be manufactured with use of a semiconductor stepper. The insulating layer 122 having a lower limit film thickness of 2 μm or more can be manufactured with use of a stepper or scanner for flat panels. In view of the above, the insulating layer 122 should preferably have a film thickness of 1 μm to 10 μm, and more preferably a film thickness of 2 μm to 7 μm, for example. In the present embodiment, portions of the insulating layer 122 between the openings adjacent to each other in the column direction have a film thickness of 4.5 μm or more at portions, and other portions of the insulating layer 122 have a film thickness of 6 μm. The pixel electrode layers 119 are rectangular in plan view, and are made of a light-reflective material. The pixel electrode layers 119, which are arranged in a matrix, each correspond to any one of three subpixels 100aR, 100aG, and 100aB that are arranged in the row direction in this order (hereinafter referred to collectively as subpixels 100a when no distinction is made therebetween).

The insulating layer 122 is layered above the pixel electrode layers 119 which are arranged in a matrix. Above each of the pixel electrode layers 119, the insulating layer 122 has three opening lines 122z1, 122z2, and 122z3 that are arranged in the row direction. The opening line 122z1 is constituted from tapered openings 122z11, 122z12, . . . , whose width decreases downward in the thickness direction, which are arranged in the column direction. Similarly, the opening line 122z2 is constituted from tapered openings 122z21, 122z22, . . . , whose width decreases downward in the thickness direction, which are arranged in the column direction. Furthermore, the opening line 122z3 is constituted from tapered openings 122z31, 122z32, . . . , whose width decreases downward in the thickness direction, which are arranged in the column direction. Note that the opening lines are collectively referred to as opening lines 122zx when no distinction is made between the opening lines, and the openings are collectively referred to as openings 122zxy when no distinction is made between the openings. The openings 122zxy are truncated cones, and have cross sections taken along the thickness direction whose width increases toward the upper surface of the insulating layer 122 in FIG. 4B. When a depth, an upper width in the row direction, and a lower width in the row direction in the cross section of the openings 122zxy are represented by D, $W_h$, and $W_l$, respectively, the following relationships should preferably be satisfied:

$$0.5 \leq W_l/W_h \leq 0.8$$

$$0.5 \leq D/W_l \leq 2.0$$

Also, a gradient R formed by walls of the openings 122zxy is determined by $R=(W_h-W_l)/2D$.

With respect to each of the opening lines 122zx, in a lower surface (surface near the pixel electrode layers 119) of the insulating layer 122, portions between the openings 122zxy adjacent to each other in the column direction are separated from each other. Meanwhile, in an upper surface of the insulating layer 122, portions between the openings 122zxy adjacent to each other in the column direction overlap with each other so as to be communicated with each other. Circular regions inside the openings 122zxy in the lower surface of the insulating layer 122 constitute luminous regions 100a where light is emitted by organic compound.

The insulating sublayers 122X extending in the row direction (the X-direction in FIG. 3) are each arranged in the column direction above the column outer edges of two pixel electrode layers 119 that are adjacent to each other in the column direction and above a region adjacent to the column outer edges. A region where the insulating sublayer 122X is formed is a non-luminous region 100b. In FIG. 3, the display panel 10 includes the luminous regions 100a and the non-luminous regions 100b that alternate in the column direction. In each of the non-luminous regions 100b, the pixel electrode layer 119 has a contact region 119b (contact window) for electrical connection via a connection electrode layer 117.

The display panel 10 includes banks that are arranged in lines. Column banks 522Y extending in the column direction (the Y-direction in FIG. 3) are arranged in the row direction above the insulating sublayers 122Y, such that each of the column banks 522Y is arranged above the row outer edges of two pixel electrode layers 119 that are adjacent to each other in the row direction and above a region adjacent to the row outer edges.

Each two adjacent column banks 522Y have a gap 522z therebetween, and accordingly the display panel 10 includes a large number of alternating column banks 522Y and gaps 522z.

The display panel 10 has three types of luminous regions 100a, namely luminous regions 100aR, 100aG, and 100aB that respectively emit red light, green light, and blue light (hereinafter referred to collectively as luminous regions 100a when no distinction is made therebetween). The gaps 522z include red gaps 522zR, green gaps 522zG, and blue gaps 522zB that respectively correspond to the luminous regions 100aR, 100aG, and 100aB (hereinafter referred to collectively as gaps 522z when no distinction is made therebetween). One set of the luminous regions 100aR, 100aG, and 100aB, which correspond to respective three subpixels 100se arranged in the row direction, constitutes a unit pixel 100e for color display.

Column light shielding sublayers 129Y are provided above the pixel electrode layers 119 so as to overlap row outer edges of the pixel electrode layers 119. Also, row light shielding sublayers 129X are provided above the pixel electrode layers 119 so as to overlap column outer edges of the pixel electrode layers 119 and so as not to partially overlap the contact regions 119b.

4. Configuration of Components of Display Panel 10

Figure 5:
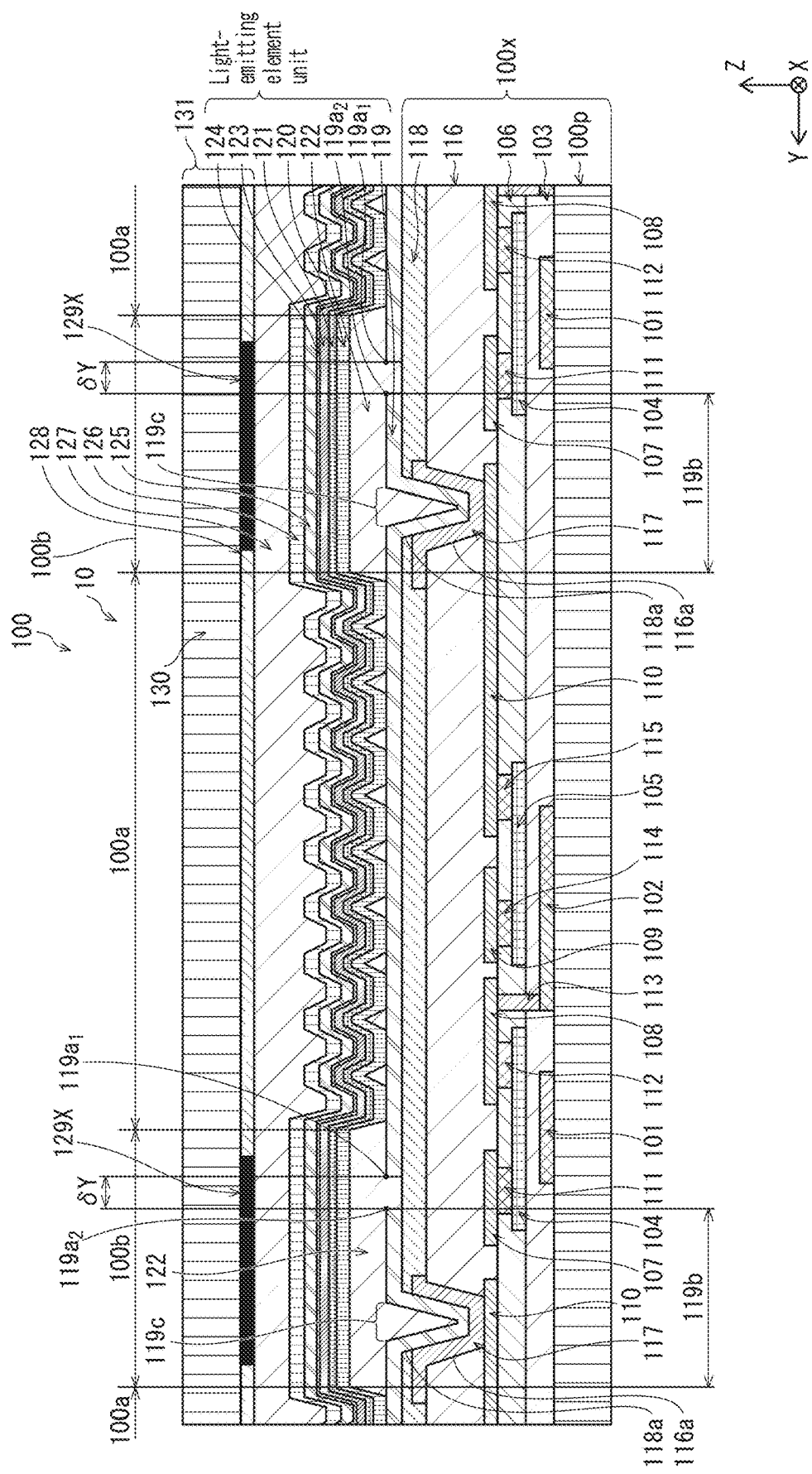
FIG. 5 is a schematic cross-sectional view taken along a line A-A in FIG. 4B.
Figure 6:
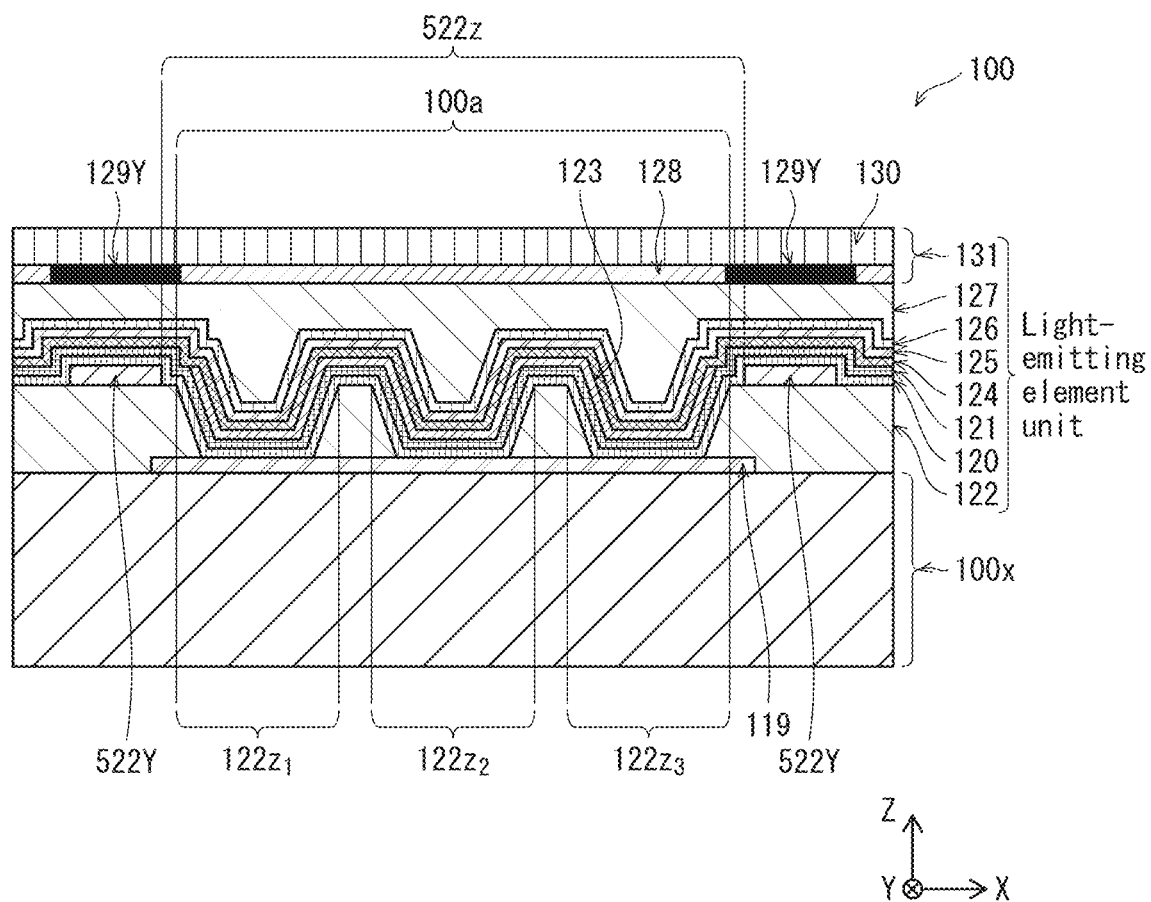
FIG. 6 is a schematic cross-sectional view taken along a line B-B in FIG. 4B.

The following describes the configuration of the organic EL elements 100 of the display panel 10 with reference to schematic cross-sectional views in FIGS. 5 and 6. FIGS. 5 and 6 are schematic cross-sectional views respectively taken along a line A-A and a line B-B in FIG. 4B.

The display panel 10 relating to the present embodiment is of an organic EL display panel of the top-emission type, and includes the substrate 100x (TFT substrate) on which the TFTs are formed in a lower part in the Z-axis direction and the organic EL element units are formed thereon.

4.1 Substrate 100x (TFT Substrate)

In FIG. 5, gate electrodes 101 and 102 are formed with an interval therebetween on a lower substrate 100p, and a gate insulating layer 103 is formed so as to cover respective surfaces of the gate electrodes 101 and 102 and the lower substrate 100p. Channel layers 104 and 105 are formed on the gate insulating layer 103 so as to respectively correspond to the gate electrodes 101 and 102. A channel protection layer 106 is formed so as to cover respective surfaces of the channel layers 104 and 105 and the gate insulating layer 103.

Source electrodes 107 and drain electrodes 108 are formed with an interval therebetween on the channel protection layer 106 so as to correspond to the gate electrodes 101 and the channel layers 104. Similarly, source electrodes 110 and drain electrodes 109 are formed with an interval therebetween on the channel protection layer 106 so as to correspond to the gate electrode 102 and the channel layer 105.

Source lower electrodes 111 and 115 are respectively formed below the source electrodes 107 and 110 by being inserted through the channel protection layer 106. Drain lower electrodes 112 and 114 are respectively formed below the drain electrodes 108 and 109 by being inserted through the channel protection layer 106. The source lower electrodes 111 and the drain lower electrodes 112 have low portions in the Z-axis direction that are in contact with the channel layer 104. The drain lower electrodes 114 and the source lower electrodes 115 have low portions in the Z-axis direction that are in contact with the channel layer 105.

Also, the drain electrodes 108 are connected with the gate electrodes 102 via contact plugs 113 that are provided by being inserted through the gate insulating layer 103 and the channel protection layer 106.

Note that the gate electrodes 101, the source electrodes 107, and the drain electrodes 108 respectively correspond to the gate $G_2$, the source $S_2$, and the drain $D_2$ in FIG. 2. Similarly, the gate electrodes 102, the source electrodes 110, and the drain electrodes 109 respectively correspond to the gate $G_1$, the source $S_1$, and the drain $D_1$ in FIG. 2. Accordingly, the switching transistor $Tr_2$ and the drive transistor $Tr_1$ are respectively formed leftward and rightward in the Y-axis direction in FIG. 6.

Note that the above configuration is just an example, and the arrangement of the transistors $Tr_1$ and $Tr_2$ is not limited to that in FIG. 5 and any configuration may be employed such as top-gate, bottom-gate, channel-etch, and etch-stop.

Passivation layers 116 are formed so as to cover the respective surfaces of the source electrodes 107 and 110, the drain electrodes 108 and 109, and the channel protection layer 106. The passivation layers 116 have contact holes 116a above part of upper portions of the source electrodes 110. The connection electrode layers 117 are layered so as to be along side walls of the contact holes 116a.

The connection electrode layers 117 have lower portions in the Z-axis direction that are connected with the source electrodes 110, and also have upper portions that are partially on the passivation layers 116. An interlayer insulating layer 118 is layered so as to cover respective surfaces of the connection electrode layers 117 and the passivation layers 116.

4.2 Organic EL Element Unit (1) Pixel Electrode Layers 119

The pixel electrode layers 119 are formed in units of subpixels on the interlayer insulating layer 118. The pixel electrode layers 119 are provided for supplying carries to the light emitting layers 123. When functioning as anodes for example, the pixel electrode layers 119 supply holes to the light emitting layers 123. Also, since the display panel 10 is of the top-emission type, the pixel electrode layers 119 are light-reflective. The pixel electrode layers 119 are rectangular and plate-like. The pixel electrode layers 119 are arranged on the substrate 100x with intervals δX therebetween in the row direction and with intervals δY therebetween in the column direction in the gaps 522z. Furthermore, the pixel electrode layers 119 have the connection concave parts 119c that are connected with the connection electrode layers 117 through contact holes 118a that are provided above the connection electrode layers 117 in the inter insulating layer 118. Accordingly, the pixel electrode layers 119 are each connected with the source $S_1$ of the TFT via the connection electrode layer 117. The connection concave parts 119c of the electrode layers 119 are concave toward the substrate 100x.

The pixel electrode layers 119 have column outer edges 119a1 and 119a2, and the connection concave parts 119c are provided on the side of the column outer edges 119a2. The contact regions 119b are ranges from the column outer edges 119a2 to regions including the connection concave parts 119c.

(2) Insulating Layer 122

The insulating layer 122 is made of an insulating material, and is formed so as to cover at least end edges of the pixel electrode layers 119 which are arranged in a matrix.

Above each of the pixel electrode layers 119 except the contact regions 119b, the insulating layer 122 has the truncated conical openings 122zxy that are arranged in a matrix. In FIGS. 5 and 6, in the openings 122zxy, the insulating layer 122 is not located on upper surfaces of the pixel electrode layers 119. The pixel electrode layers 119 are exposed in these openings so as to be in contact with a hole injection layer 120, which is described later. This configuration allows electrical charge supply in these openings from the pixel electrode layers 119 to the hole injection layer 120. Accordingly, the minimum rectangular region including all the openings 122zxy is the luminous region 100a where light is emitted by organic compound of any of the R, G, and B colors. Also, a gap of the insulating layer 122 between each two luminous regions 100a which are arranged in the column direction is the non-luminous region 100b. Here, in FIG. 6, portions of the insulating layer 122 between the openings 122zxy adjacent to each other in the row direction are high in terms of both width and height. Meanwhile, in FIG. 5, portions of the insulating layer 122 between the openings 122zxy adjacent to each other in the column direction are low in terms of both width and height. This configuration suppresses reduction in area of the reflectors configured from the openings 122zxy and the insulating layer 122, and also improves the ink spread to achieve uniform film thickness of the light emitting layers and the like, as described later.

Also, the insulating layer 122 includes the insulating sublayers 122Y, which are gaps between luminous regions 100a extending in the column direction and arranged in the row direction. Accordingly, the insulating sublayers 122Y define the row outer edges of the luminous regions 100a in the subpixels 100se.

Also, the insulating layer 122 includes the insulating sublayers 122X (corresponding to the non-luminous regions 100b), which are gaps between luminous regions 100a extending in the row direction and arranged in the column direction. In FIG. 4A, the insulating sublayers 122X are arranged above the contact regions 119b of the pixel electrode layers 119 and above the column outer edges 119a1 and 119a2 of the pixel electrode layers 119 which are adjacent to each other in the column direction. The insulating sublayers 122X cover the column outer edges 119a1 and 119a2 of the pixel electrode layers 119 thereby to prevent electric leakage between the pixel electrode layers 119 and the counter electrode layer 125, and thereby to define the column outer edges of the luminous regions 100a in the subpixels 100se.

(3) Column Banks 522Y

The column banks 522Y, extending in the column direction, are arranged in the row direction above the insulating sublayers 122Y. The column banks 522Y define the row outer edges of the light emitting layers 123, which are formed by stemming the flow in the row direction of the ink containing organic compound as the material of the light emitting layers 123. The column banks 522Y are each provided above a pair of the row outer edges 119a3 and 119a4 of two adjacent pixel electrode layers 119 so as to partially overlap the pixel electrode layers 119. The column banks 522Y are linear and each have a forward-tapered trapezoidal cross section taken along the row direction whose width decreases upwards. The column banks 522Y are provided in the column direction so as to be perpendicular to the insulating sublayers 122X, and have upper surfaces that are higher in position than the upper surfaces 122xb of the insulating sublayers 122X.

(4) Hole Injection Layer 120 and Hole Transport Layer 121

A hole injection layer 120 and a hole transport layer 121 are layered in this order on the column banks 522Y and on the pixel electrode layers 119 in the openings 122zxy. The hole transport layer 121 is in contact with the hole injection layer 120. The hole injection layer 120 and the hole transport layer 121 have a function of transporting holes, which are injected from the pixel electrode layers 119, to the light emitting layers 123.

(5) Light Emitting Layers 123

The display panel 10 includes a large number of alternating column banks 522Y and gaps 522z. The light emitting layers 123 extend in the column direction on an upper surface of the hole transport layer 121 in the gaps 522z which are defined by the column banks 522Y The light emitting layer 123 emitting light of the R, G, and B colors are formed respectively in the red gaps 522zR, the green gaps 522zG, and the blue gaps 522zB, which respectively correspond to the luminous regions 100aR, 100aG, and 100aB.

The light emitting layers 123 are made of organic compound, and have a function of emitting light through recombination of holes and electrons thereinside. In the gaps 522z, the light emitting layers 123 are provided so as to be linear and extend in the column direction.

Light is emitted from only parts of the light emitting layers 123 to which carriers are supplied from the pixel electrode layers 119, and accordingly no electroluminescence of organic compound occurs in regions of the light emitting layers 123 where the insulating layer 122 is provided, which is made of an insulating material. Thus, light is emitted from only parts of the light emitting layers 123, positioned in the openings 122zxy where no insulating layer 122 is provided. These minimum rectangular regions including the openings 122zxy are the luminous regions 100a.

In the light emitting layers 123, light is not emitted from parts that are located above the insulating sublayers 122X. These parts are the non-luminous regions 100b. In other words, the non-luminous regions 100b correspond to the insulating sublayers 122X that are projected in plan view.

(6) Electron Transport Layer 124

An electron transport layer 124 is formed on the column banks 522Y and on the light emitting layers 123 in the gaps 522z which are defined by the column banks 522Y. In this example, the electron transport layer 124 extends over parts of the column banks 522Y that are exposed from the light emitting layers 123. The electron transport layer 124 has a function of transporting electrons, which are injected from the counter electrode layer 125, to the light emitting layers 123.

(7) Counter Electrode Layer 125

The counter electrode layer 125 is formed so as to cover the electron transport layer 124. The counter electrode layer 125 is continuous over the entire display panel 10, and may be connected to a bus-bar wiring per pixel or per several pixels (not shown). The counter electrode layer 125 and the pixel electrode layers 119 in pairs sandwich the light emitting layers 123 therebetween to form an energizing path to supply carries to the light emitting layers 123. When functioning as a cathode for example, the counter electrode layer 125 supplies electrons to the light emitting layers 123. The counter electrode layer 125 is formed so as to be along a surface of the electron transport layer 124, and is a common electrode for the light emitting layers 123.

Since the display panel 10 is of the top-emission type, the counter electrode layer 125 is made of a light-transmissive and conductive material. The counter electrode layer 125 is made for example of indium tin oxide (ITO) or indium zinc oxide (IZO). Alternatively, the counter electrode layer 125 may be a thin electrode film made of silver (Ag), aluminum (Al), or the like.

(8) Sealing Layer 126

A sealing layer 126 is formed so as to cover the counter electrode layer 125. The sealing layer 126 is provided in order to suppress degradation of the light emitting layers 123 due to exposure to moisture, air, and so on. The sealing layer 126 is provided for the entire display panel 10 so as to cover an upper surface of the counter electrode layer 125. Since the display panel 10 is of the top-emission type, the sealing layer 126 is made of a light-transmissive material such as silicon nitride and silicon oxynitride.

(9) Bond Layer 127

A bond layer 127 bonds the sealing layer 126 and a CF substrate 131 that is provided above the sealing layer 126 in the Z-axis direction. The CF substrate 131 includes an upper substrate 130 that has a lower main surface in the Z-axis direction on which color filter layers 128 and a light shielding layer 129 are formed. The bond layer 127 bonds a rear panel that is composed of the substrate 100X and the layers ranging from the pixel electrode layers 119 to the sealing layer 126, to the CF substrate 131. The bond layer 127 also has a function of preventing the layers from being exposed to moisture, air, and so on.

Also, when refractive indices of the bond layer 127 and the insulating layer 122 of the display panel 10 are represented by $n_1$ and $n_2$, respectively, the following relationships should preferably be satisfied: $1.1 \le n_1 \le 1.8$; and $|n_1 - n_2| \ge 0.20$. Further, when a gradient of slopes of the reflectors is represented by $\theta$, the following relationships should preferably be satisfied: $n_2 < n_1$; and $75.2 - 54(n_1 - n_2) \le \theta \le 81.0 - 20(n_1 - n_2)$.

(10) Upper Substrate 130

The CF substrate 131, which includes the upper substrate 130 on which the color filter layers 128 and the light shielding layer 129 are formed, is bonded onto the bond layer 127. Since the display panel 10 is of the top-emission type, the upper substrate 130 is made of a light-transmissive material such as a cover glass and a transparent resin film. Also, providing the upper substrate 130 for example improves the rigidity of the display panel 10, and prevents moisture, air, and so on from intruding the display panel 10.

(11) Color Filter Layers 128

The color filter layers 128 are formed on the upper substrate 130 so as to correspond in position and color to the luminous regions 100a. The color filter layers 128 are transparent layers that are provided for transmitting visible light of wavelength corresponding to the R, G, and B colors, and have a function of transmitting light emitted from the R, G, and B pixels and correcting chromaticity of the light. In this example, the red color filter layers 128R, the green color filter layers 128G, and the blue color filter layers 128B are respectively formed above the luminous regions 100aR in the red gaps 522zR, the luminous regions 100aG in the green gaps 522zG, and the luminous regions 100aB in the blue gaps 522zB. Specifically, the color filter layers 128 are formed for example through a process of applying an ink containing color filter materials and a solvent to the upper substrate 130, which is made of a cover glass for color filter formation having openings arranged in a matrix in units of pixels.

(12) Light Shielding Layer 129

The light shielding layer 129 is formed on the upper substrate 130 so as to correspond in position to boundaries between the luminous regions 100a in the pixels.

The light shielding layer 129 is a black resin layer that is provided in order to prevent transmission of visible light of wavelength corresponding to the R, G, and B colors. The light shielding layer 129 is made for example of a resin material including black pigment having excellent light absorbing property and light shielding property. The light shielding layer 129 is provided also in order to prevent external light from entering the display panel 10, prevent the internal components from being seen through the upper substrate 130, and suppress reflection of external light thereby to achieve the contrast improvement of the display panel 10, and so on. Note that reflection of external light is a phenomenon caused when external light, which has entered the display panel 10 from above the upper substrate 130, is reflected at the pixel electrode layers 119 and thus is emitted from the upper substrate 130.

Also, the light shielding layer 129 has a function of blocking leakage of light emitted from each of the R, G, and B pixels to an adjacent pixel, thereby to prevent unclear boundaries between the pixels. The light shielding layer 129 further has a function of increasing the color purity of light emitted from the pixels.

The light shielding layer 129 includes the column light shielding sublayers 129Y, which extend in the column direction and are arranged in the row direction, and the row light shielding sublayers 129X, which extend in the row direction and are arranged in the column direction. A lattice shape is formed by the column light shielding sublayers 129Y and the row light shielding sublayers 129X. In the organic EL elements 100, the column light shielding sublayers 129Y are arranged so as to overlap the insulating sublayers 122Y in FIG. 6, and the row light shielding sublayers 129X are arranged so as to overlap the insulating sublayers 122X in FIG. 5.

4.3 Materials of Components

The following describes an example of materials of the components shown in FIGS. 5 and 6.

(1) Substrate 100x (TFT Substrate)

The substrate 100x is made of a known material for TFT substrate.

The lower substrate 100p is for example a glass substrate, a quartz substrate, a silicon substrate, a metal substrate made of molybdenum sulfide, copper, zinc, aluminum, stainless, magnesium, iron, nickel, gold, or silver, a semiconductor substrate made of gallium arsenide base or the like, or a plastic substrate.

Either thermoplastic resin or thermosetting resin may be used as a plastic material. The plastic material may be for example a single layer of any one type of the following materials or a laminate of any two or more types of the following materials including polyethylene, polypropylene, polyamide, polyimide (PI), polycarbonate, acrylic resin, polyethylene terephthalate (PET), polybutylene terephthalate, polyacetal, other fluororesin, thermoplastic elastomer such as styrene elastomer, polyolefin elastomer, polyvinyl chloride elastomer, polyurethane elastomer, fluorine rubber elastomer, and chlorinated polyethylene elastomer, epoxy resin, unsaturated polyester resin, silicone resin, polyurethane, or copolymer, blend, polymer alloy or the like mainly including such a material.

The gate electrodes 101 and 102 are made for example of a laminate of copper (Cu) and molybdenum (Mo). Alternatively, other metal material is adoptable.

The gate insulating layer 103 is made for example of any known electrically-insulating material such as silicon dioxide ($SiO_2$) and silicon nitride ($SiN_x$), regardless of whether the material is organic or inorganic.

The channel layers 104 and 105 are made of oxide semiconductor including at least one of indium (In), gallium (Ga), and zinc (Zn).

The channel protection layer 106 is made for example of silicon oxynitride (SiON), silicon nitride (SiN), or aluminum oxide (AlOx).

The source electrodes 107 and 110 and the drain electrodes 108 and 109 are made for example of a laminate of copper-manganese (CuMn), copper (Cu), and molybdenum (Mo).

The similar material is adoptable for the source lower electrodes 111 and 115 and the drain lower electrodes 112 and 114.

The passivation layers 116 are made for example of silicon dioxide ($SiO_2$), silicon nitride (SiN), silicon oxynitride (SiON), or a laminate thereof.

The connection electrode layers 117 are made for example of a laminate of copper-manganese (CuMn), copper (Cu), and molybdenum (Mo). Alternatively, the material of the connection electrode layers 117 may be appropriately selected from conductive materials.

The interlayer insulating layer 118 is made for example of an organic compound such as polyimide, polyamide, and acrylic resin, and has a film thickness of 2000 nm to 8000 nm for example.

(2) Pixel Electrode Layers 119

The pixel electrode layers 119 are made of a metal material. The display panel 10 relating to the present embodiment, which is of the top-emission type, should preferably have a surface part that is highly light-reflective. In the display panel 10 relating to the present embodiment, the pixel electrode layers 119 each may be a laminate including layers selected from a metal layer, an alloy layer, and a transparent conductive layer. The metal layer is made for example of a metal material including silver (Ag) or aluminum (Al). The alloy layer is made for example of alloy of silver, palladium, and copper (APC), alloy of silver, rubidium, and gold (ARA), alloy of molybdenum and chromium (MoCr), or alloy of nickel and chromium (NiCr). The transparent conductive layer is made for example of indium tin oxide (ITO) or indium zinc oxide (IZO).

(3) Insulating Layer 122

The insulating layer 122 has insulation properties, and is made of an organic material such as acrylic resin and polyimide resin. Alternatively, the insulating layer 122 may be made of an inorganic material such as silicon nitride (SiN) and silicon oxynitride (SiON).

(4) Column Banks 522Y

The column banks 522Y have insulating properties, and are made of an organic material such as resin. Examples of the organic material of the column banks 522Y include acrylic resin, polyimide resin, and novolac phenolic resin. The column banks 522Y should preferably have an organic solvent resistance. Also, the column banks 522Y sometimes undergo an etching process, a baking process, and so on during the manufacturing process, and accordingly should preferably be made of a highly resistant material in order to avoid excessive distortion, transformation, and the like due to such processes. Also, fluorine processing may be performed on surfaces of the column banks 522Y in order to provide the surfaces with water repellency. Alternatively, the column banks 522Y may be made of a material containing fluorine.

(5) Hole Injection Layer 120

The hole injection layer 120 is made for example of oxide of a metal such as silver (Ag), molybdenum (Mo), chromium (Cr), vanadium (V), tungsten (W), nickel (Ni), and iridium (Ir), or a conductive polymer material such as polyethylenedioxythiophene (PEDOT).

In the case where the hole injection layer 120 is made of oxide of transition metal, the hole injection layer 120 has energy levels because oxide of transition metal has oxidation numbers. This facilitates hole injection, and thus reduces driving voltage.

(6) Hole Transport Layer 121

The hole transport layer 121 is made for example of a high-molecular compound such as polyfluorene, polyfluorene derivative, polyallylamine, and polyallylamine derivative.

(7) Light Emitting Layers 123

The light emitting layers 123 have a function of emitting light by excitation resulting from injection and recombination of holes and electrons, as described above. The light emitting layers 123 need to be made of a luminous organic material by a wet printing method.

Specifically, the light emitting layers 123 should preferably be made for example of a fluorescent substance, such as oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, and metal complex of 8-hydroxyquinoline compound, metal complex of 2-bipyridine compound, complex of a Schiff base and group III metal, oxine metal complex, and rare earth complex.

(8) Electron Transport Layer 124

The electron transport layer 124 is made for example of oxydiazole derivative (OXD), triazole derivative (TAZ), or phenanthroline derivative (BCP Bphen). Also, to improve an electron injection property, such an organic material may be doped with a metal material by co-evaporation of alkali metal or alkaline-earth metal. Alternatively, the electron transport layer 124 may be made of alkali metal fluoride such as sodium fluoride (NaF) or a laminate of alkali metal fluoride and an organic layer.

(9) Counter Electrode Layer 125

The counter electrode layer 125 is made for example of indium tin oxide (ITO) or indium zinc oxide (IZO). Alternatively, the counter electrode layer 125 may be a thin electrode film made of silver (Ag), aluminum (Al), or the like.

(10) Sealing Layer 126

The sealing layer 126 has a function of preventing the organic layers such as the light emitting layers 123 from being exposed to moisture, air, and so on. The sealing layer 126 is made for example of a light-transmissive material such as silicon nitride (SiN) and silicon oxynitride (SiON). Also, a resin sealing layer that is made of a resin material such as acrylic resin and silicone resin may be provided on a layer that is made of a material such as silicon nitride (SiN) and silicon oxynitride (SiON).

Since the display panel 10 relating to the present embodiment is of the top-emission type, the sealing layer 126 needs to be made of a light-transmissive material.

(11) Bond Layer 127

The bond layer 127 is made for example of a resin adhesive. A light-transmissive resin material is adoptable such as acrylic resin, silicone resin, and epoxy resin.

(12) Upper Substrate 130

The upper substrate 130 is made for example of a light-transmissive material such as glass, quartz, and plastic.

(13) Color Filter Layers 128

The color filter layers 128 are made of a known resin material (for example, the color resist manufactured by JSR Corporation) or the like.

(14) Light Shielding Layer 129

The light shielding layer 129 is made mainly of an ultraviolet curable resin, such as an ultraviolet curable acrylic resin, to which black pigment is added. The black pigment is for example carbon black pigment, titanium black pigment, metal oxide pigment, or organic pigment.

4.4 Improvement of Light Extraction Efficiency by Reflectors

The display panel 10 includes: the reflectors (reflective structure) that are configured from the insulating layer 122, which has the openings 122zxy, and the bond layer 127, which has a rear surface that is convex along the openings 122zxy of the insulating layer 122; and the light emitting layers 123, which are provided between the insulating layer 122 and the bond layer 127. The openings 122zxy have profiles of trapezoidal cross sections taken along the thickness direction whose width increase upward. When the refractive indices of the bond layer 127 and the insulating layer 122 are represented by $n_1$ and $n_2$, respectively, the following relationships are satisfied.

$$1.1 \leq n_1 \leq 1.8$$

$$|n_1 - n_2| \geq 0.20$$

Here, the refractive index $n_2$ should preferably be 1.4 to 1.6.

Also, when a depth, an upper width, and a lower width in the cross section of the openings 122zxy are represented by D, $W_h$, and $W_l$, respectively, the following relationships should preferably be satisfied.

$$0.5 \leq W_l/W_h \leq 0.8$$

$$0.5 \leq D/W_l \leq 2.0$$

With the above shape and refractive index conditions, it is possible to improve the light extraction efficiency of the light emitting layers 123 owing to the openings 122zxy of the insulating layer 122, which function as the reflectors. According to the inventors' consideration, this results in increase of luminance per subpixel by 1.2 times to 1.5 times of that in display panels with no reflector.

Figure 7A:
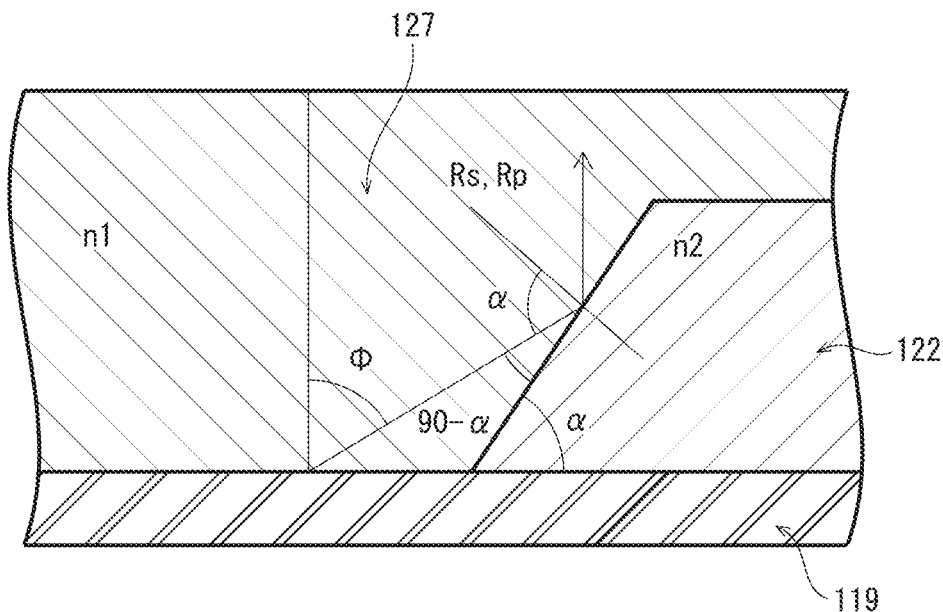
FIG. 7A is a schematic view of a method of calculating a gradient α formed by walls of openings 122$zxy$ for achieving total reflection in organic EL elements 100.
Figure 7B:
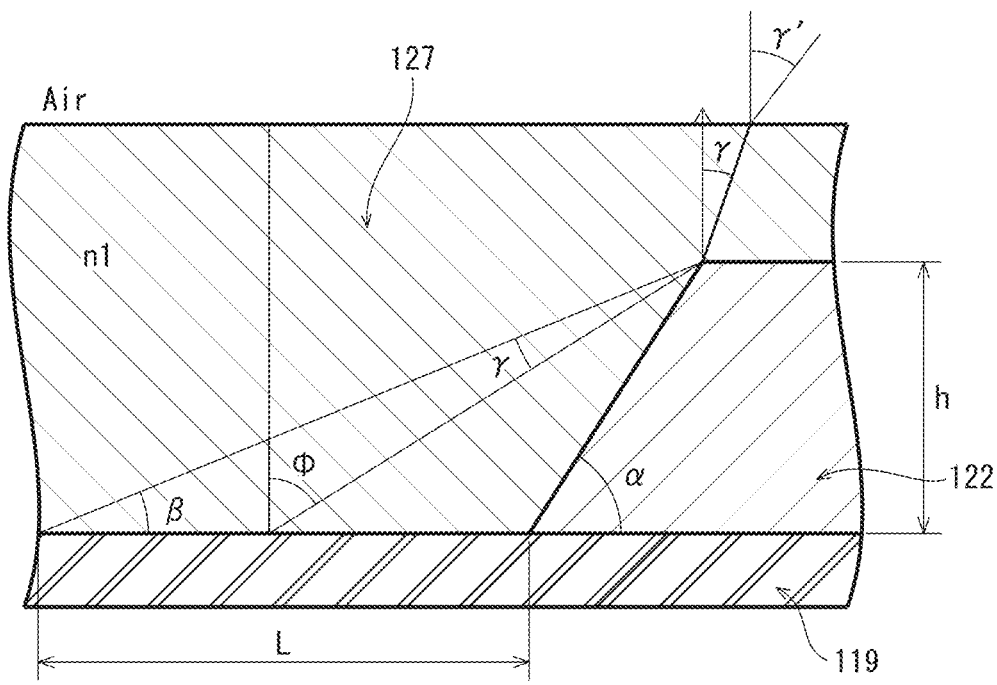
FIG. 7B is a schematic view of a method of calculating an effective luminous range L where emitted light is reflected at the walls of the openings 122$zxy$ to reach an effective viewing angle γ'.

FIG. 7A is a schematic view of a method of calculating a gradient α formed by the walls of the openings 122zxy for achieving total reflection in the organic EL elements 100 with the reflectors. FIG. 7B is a schematic view of a method of calculating an effective luminous range L where emitted light is reflected at the walls of the openings 122zxy to reach an effective viewing angle γ'.

When an incident angle at the walls of the openings 122zxy is represented by φ in FIG. 7A, the following relationships are satisfied.

$$\varphi=2(90-\alpha)=180-2\alpha$$

$$\alpha=90-\varphi/2$$

A gradient $\alpha_z$ for achieving total reflection is calculated by the following relationship.

$$\alpha_z=\sin^{-1}(n_2/n_1)$$

The effective luminous range L, which is a range where emitted light is reflected at the walls of the openings 122zxy to reach the effective viewing angle γ', in FIG. 7B is calculated by the following relationships.

$$\gamma=\sin^{-1}(\sin \gamma'/n_1))$$

$$\beta=90-\varphi-\gamma$$

$$L=h(1/\tan \beta-1/\tan \alpha)$$

For example, relationships $n_1=1.8$, α=70°, γ'=20°, and h=5 μm are satisfied, the following relationships are satisfied: φ=40°, γ=11°, β=39°, and L=4.4 μm.

5. Manufacturing Method of Display Panel 10

The following describes a manufacturing method of the display panel 10 with reference to the drawings. FIGS. 8A to 8E, FIGS. 9A to 9D, and FIGS. 10A to 10C are schematic cross-sectional views showing the processes of manufacturing the display panel 10, taken along a line at the same position as the line A-A in FIG. 4B. FIGS. 12A to 12D and FIGS. 13A to 13D are schematic cross-sectional views showing the processes of manufacturing the display panel 10, taken along a line at the same position as the line B-B in FIG. 4B.

(1) Formation of Substrate 100x (TFT Substrate)

Figure 8A:
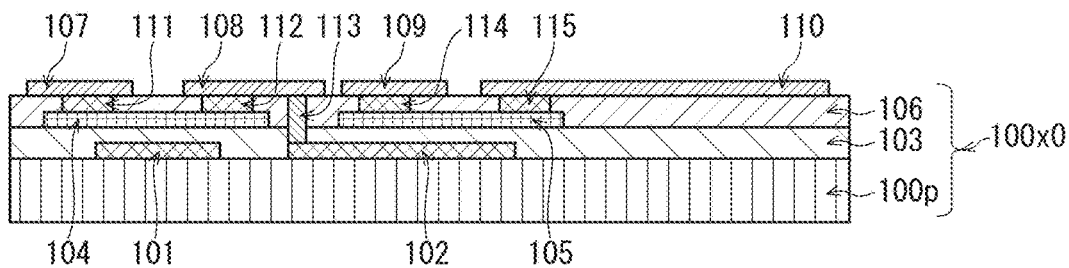
FIGS. 8A to 8E are schematic cross-sectional views of the organic EL display panel 10 during manufacture relating to at least one aspect, taken along a line at the same position as the line A-A in FIG. 4B, where

First, a substrate 100x0 is prepared. The substrate 100x0 has formed thereon components from drain electrodes 101 and 102 to source electrodes 107 and 110 and drain electrodes 108 and 109 (FIG. 8A). The substrate 100x0 is manufactured by a known TFT manufacturing method.

Figure 8B:
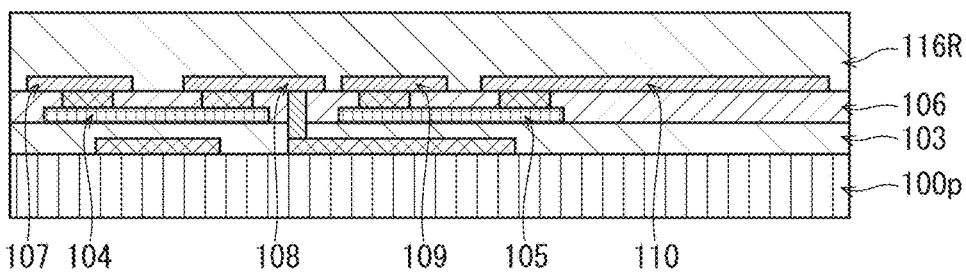

Next, passivation layers 116 are formed for example with a plasma CVD method or a sputtering method so as to cover the source electrodes 107 and 110, the drain electrodes 108 and 109, and a channel protection layer 106 (FIG. 8B).

Figure 8C:
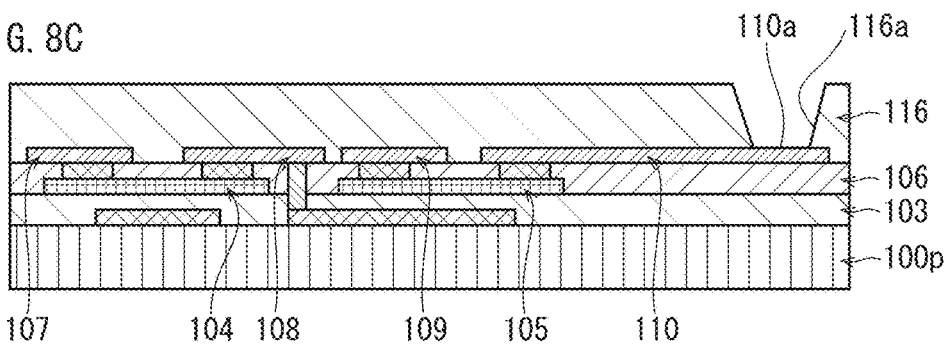

Next, a contact hole 116a is provided in each of the source electrodes 110 in the passivation layers 116 with a dry etching method (FIG. 8C). The contact hole 116a is provided so as to have a bottom in which a surface 110a of the source electrode 110 is exposed.

Figure 8D:
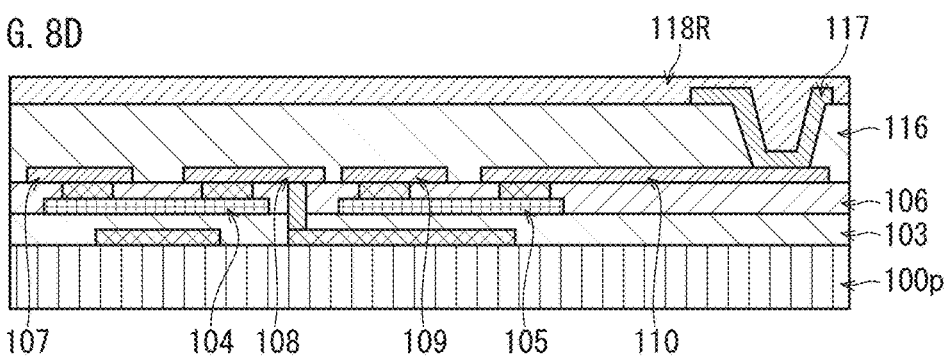

Next, connection electrode layers 117 are formed so as to be along inner walls of the contact holes 116a provided in the passivation layers 116. The connection electrode layers 117 have upper portions that are partially on the passivation layers 116. The connection electrode layers 117 are formed by forming a metal film with for example the sputtering method, and then patterning the metal film with a photolithography method and a wet etching method. Furthermore, an interlayer insulating layer 118 is formed by applying an organic material onto the connection electrode layers 117 and the passivation layers 116 so as to cover these layers and planarizing a surface of the applied organic material (FIG. 8D).

(2) Formation of Pixel Electrode Layers 119

Figure 8E:
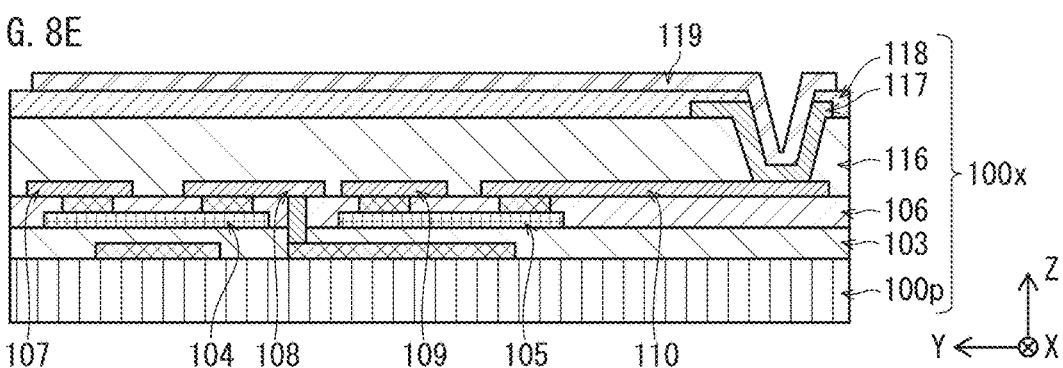

Contact holes are provided above the connection electrode layers 117 in the interlayer insulating layer 118. Then, pixel electrode layers 119 are formed in the contact holes (FIG. 8E). The pixel electrode layers 119 are formed by forming a metal film with the sputtering method, a vacuum deposition method, or the like, and then patterning the metal film with the photolithography method and an etching method. Note that the pixel electrode layers 119 are electrically connected with the connection electrode layers 117.

(3) Formation of Insulating Layer 122

Figure 9A:
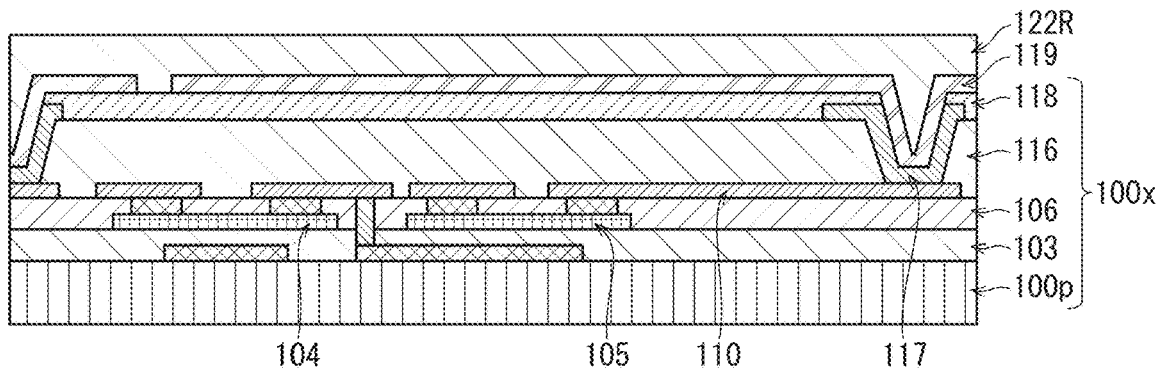
FIGS. 9A to 9D are schematic cross-sectional views of the organic EL display panel 10 during manufacture relating to at least one aspect, taken along the line at the same position as the line A-A in FIG. 4B, where
Figure 9B:
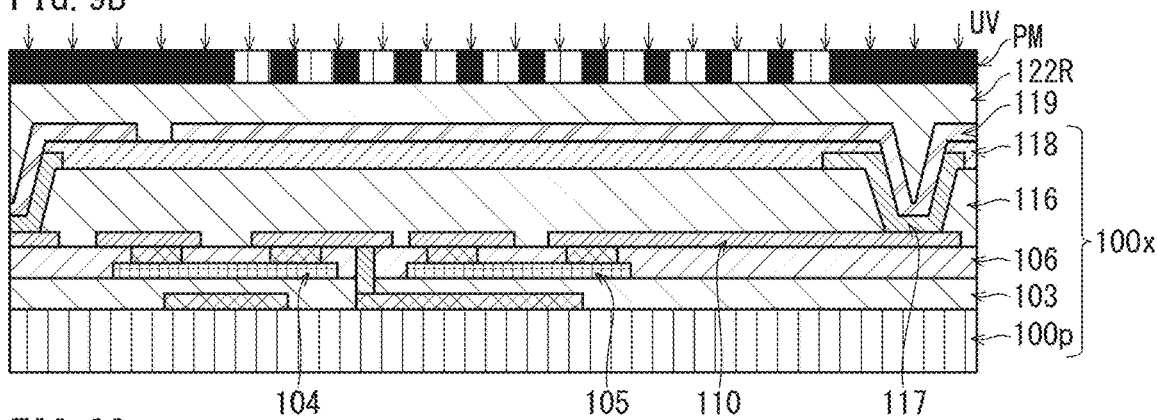
Figure 12A:
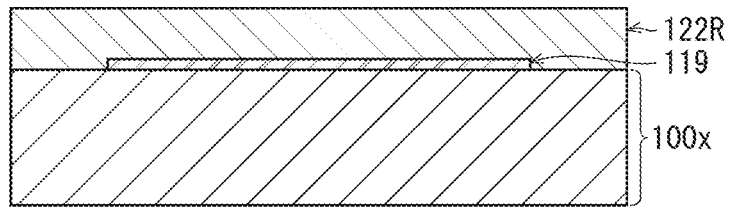
FIGS. 12A to 12D are schematic cross-sectional views of the organic EL display panel 10 during manufacture relating to at least one aspect, taken along a line at the same position as the line B-B in FIG. 4B, each showing a formation process of the insulating layer 122.
Figure 12B:
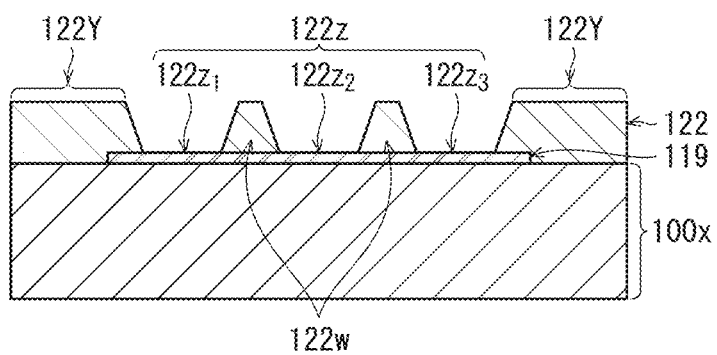

First, a photosensitive film 122R made for example of acrylic resin is formed with an application method such as a spin coat method (FIGS. 9A and 12A). Then, the photosensitive film 122R is dried and a solvent thereof is vaporized to a certain degree. Then, a photomask PM having predetermined openings is overlaid above the photosensitive film 122R. Ultraviolet irradiation is performed on the photomask PM thereby to transfer patterns of the photomask PM to a photoresist made of photosensitive material (FIGS. 9B and 12B).

In the present embodiment, the photomask PM is for example a photomask for positive photoresists that includes transmissive parts, through which light transmits (vertical stripe portions in the figures), corresponding to the openings 122zxy. As a result, the photoresist has opening patterns corresponding in shape to the transmissive parts, which correspond to the openings 122zxy.

Figure 10A:
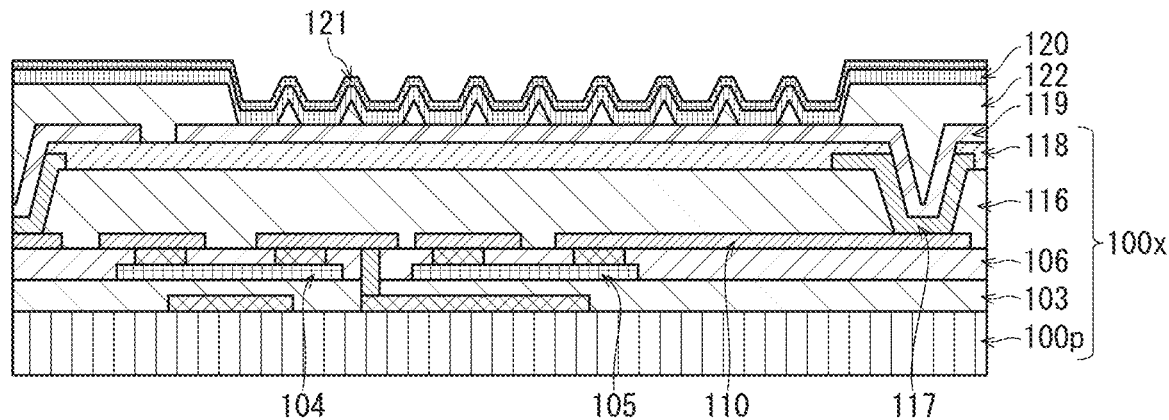
FIGS. 10A to 10C are schematic cross-sectional views of the organic EL display panel 10 during manufacture relating to at least one aspect, taken along the line at the same position as the line A-A in FIG. 4B, where
Figure 10B:
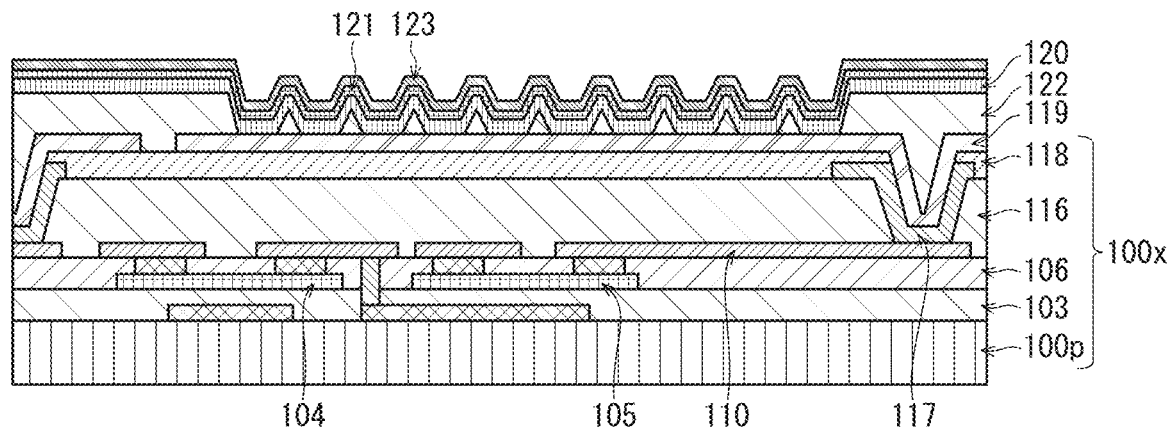
Figure 10C:
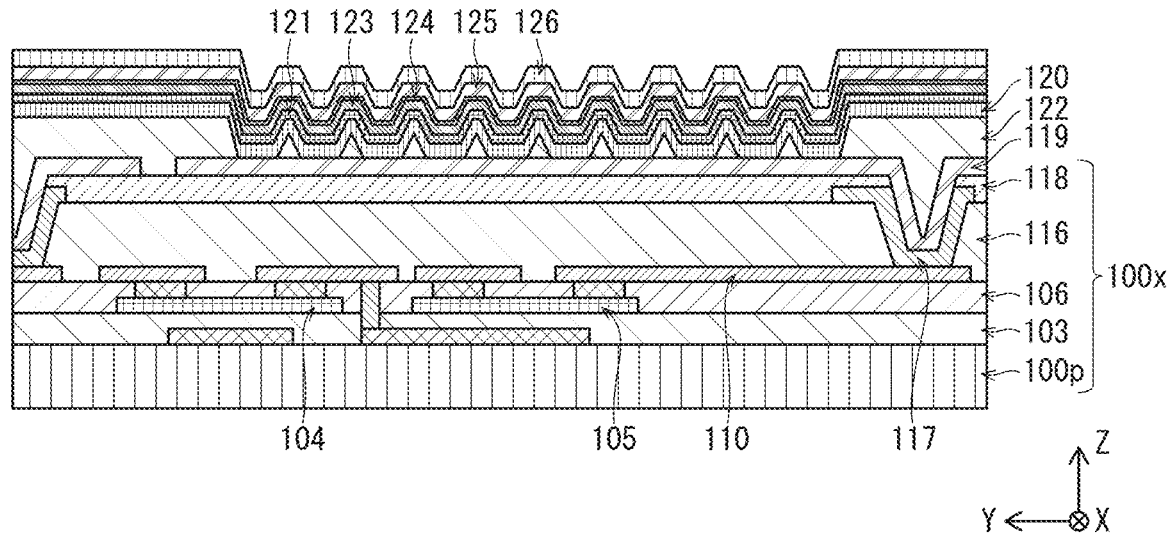
Figure 13A:
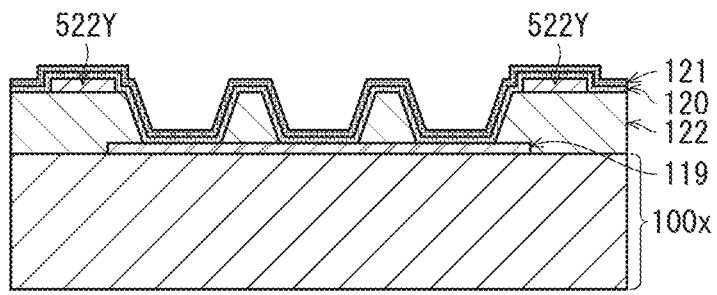
FIGS. 13A to 13D are schematic cross-sectional views of the organic EL display panel 10 during manufacture relating to at least one aspect, taken along the line at the same position as the line B-B in FIG. 4B, where
Figure 13B:
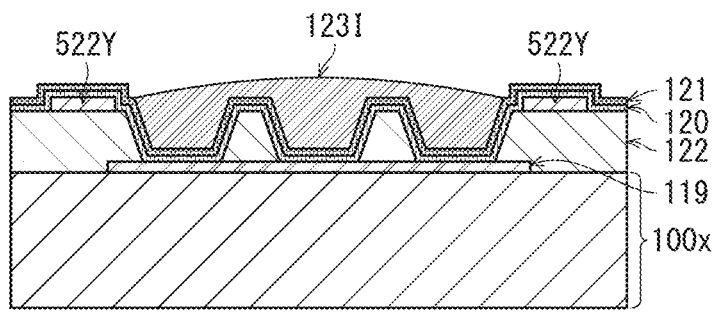
Figure 13C:
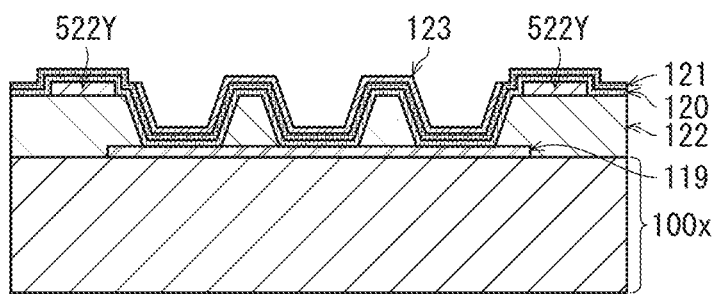

Next, development is performed on the photoresist, and as a result the photoresist has patterns of insulating sublayers 122X and 122Y and the openings 122zxy that constitute an insulating layer 122. Then, curing and firing are performed on the photoresist (FIGS. 10C and 13C). Parts of the photoresist, which have the patterns of the openings 122zxy corresponding to the transmissive parts, are removed, and thus result in no insulating layer 122. At this time, the openings 122zxy have a trapezoidal cross section taken along the thickness direction whose width increases upward, namely toward the upper surface 122Xb of the insulating layer 122, as described above. Meanwhile, parts of the photoresist, which are not exposed, result in the insulating layer 122. In this way, patterning for forming the insulating layer 122 is performed such that the insulating sublayers 122X and 122Y surround regions defining pixels and surfaces of the pixel electrode layers 119 are exposed in bottoms of the openings 122zxy. Also, a distance between the openings 122zxy adjacent to each other in the column direction is shorter than a distance between the openings 122zxy adjacent to each other in the row direction. Accordingly, portions of the insulating layer 122 that partition between the openings 122zxy adjacent to each other in the column direction are lower in terms of height than the thickness of the insulating sublayers 122Y. A specific description is given below. The insulating sublayers 122Y, which partition between the subpixels, have trapezoidal cross sections taken along a surface perpendicular to the Y-direction. Similarly, the portions of the insulating layer 122, which partition between the openings 122zxy adjacent to each other in the row direction, have trapezoidal cross sections taken along the X-direction. Meanwhile, the portions of the insulating layer 122, which partition between the openings 122zxy adjacent to each other in the column direction, have triangle cross sections taken along a surface perpendicular to the Y-direction whose thickness in the Z-direction is small.

In the case where an inorganic material is used for the insulating layer 122, the following formation process is adopted. First, the photosensitive film 122R made of metal oxide and metal nitride such as silicon nitride (SiN) and silicon oxynitride (SiON) is formed with a CVD method (FIGS. 9A and 12A). Then, the photosensitive film 122R is dried and a solvent thereof is vaporized to a certain degree. Then, a photomask PM having predetermined openings is overlaid above the photosensitive film 122R. Ultraviolet irradiation is performed on the photomask PM thereby to transfer patterns of the photomask PM to a photoresist made of photosensitive material (FIGS. 9B and 12B). Next, development and patterning by a reactive ion etching (RIE) are performed on the photoresist. This completes the insulating layer 122 with insulating sublayers 122X and 122Y and the openings 122z by patterning. (FIGS. 10C and 13C).

(4) Formation of Column Banks 522Y

Figure 9C:
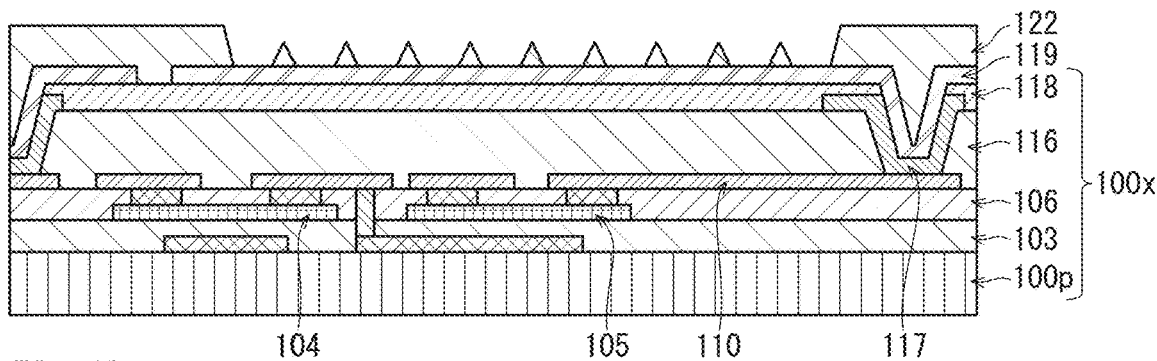
Figure 9D:
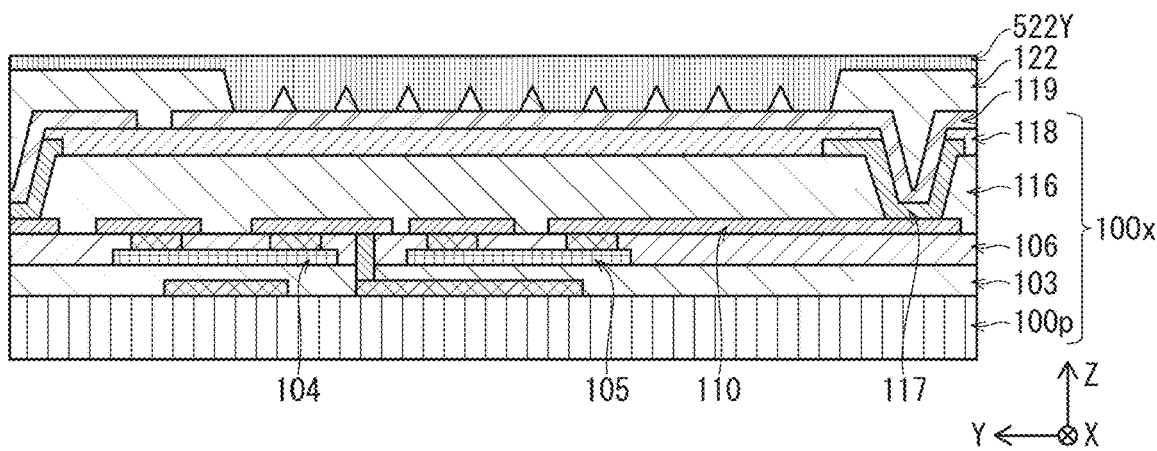
Figure 12C:
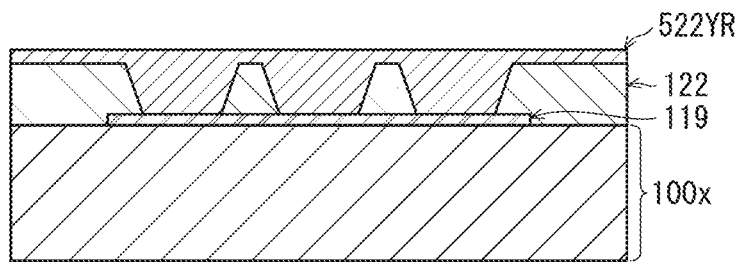
Figure 12D:
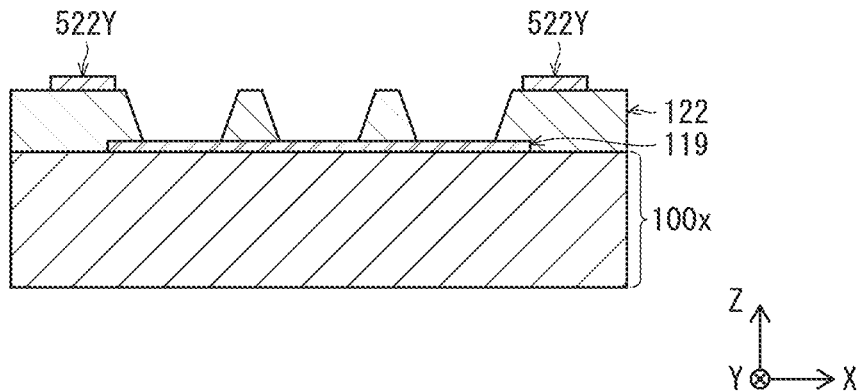

Column banks 522Y are formed as follows. First, a film 522YR made of a material of the column banks 522Y such as a photosensitive resin material is formed on the insulating layer 122 with a spin coat method or the like (FIGS. 9C and 12C). Then, the film 522YR is patterned to such that gaps 522z are provided. As a result, the column banks 522Y are formed (FIG. 12D). The gaps 522z are provided by performing exposure through a mask overlaid above the film 522YR and then performing development. The column banks 522Y, extending in the column direction along upper surfaces of the insulating sublayers 122Y, are arranged with the gaps 522z therebetween in the row direction.

(5) Formation of Hole Injection Layer 120 and Hole Transport Layers 121

A hole injection layer 120 and hole transport layers 121 are formed above the pixel electrode layers 119, the insulating layer 122, and the column banks 522Y (FIGS. 10A and 13A). the hole injection layer 120 and the hole transport layers 121 may be formed by forming metal oxide films such as tungsten oxide films with the sputtering method, and then patterning the films in units of pixels with the photolithography method and an etching method.

(6) Formation of Light Emitting Layers 123 and Electron Transport Layer 124

In the gaps 522z which are defined by the column banks 522Y, light emitting layers 123 and an electron transport layer 124 are formed on the hole transport layer 121 in this order.

The light emitting layers 123 are formed by applying an ink containing a material of the light emitting layers 123 onto the inside of the gaps 522z, which are defined by the column banks 522Y, with the ink jet method, and then firing the ink.

In formation of the light emitting layers 123, a solution for forming the light emitting layers 123 is first applied with use of an ink discharge device. Specifically, light emitting layers of the R, G, and B colors alternate above the substrate 100x in line in this order in the lateral direction in FIG. 13B. In this process, the gaps 522z, which are regions where subpixels are to be formed, are each filled using the ink jet method with any of inks 123RI, 123GI, and 123BI respectively containing materials of organic light emitting layers of the R, G, and B colors (FIG. 13B). Then, the inks are dried under a reduced pressure and are baked. As a result, the light emitting layers 123R, 123G, and 123B are complete (FIGS. 10B and 13C).

(Method of Applying Solution for Light Emitting Layer Formation)

Figure 15A:
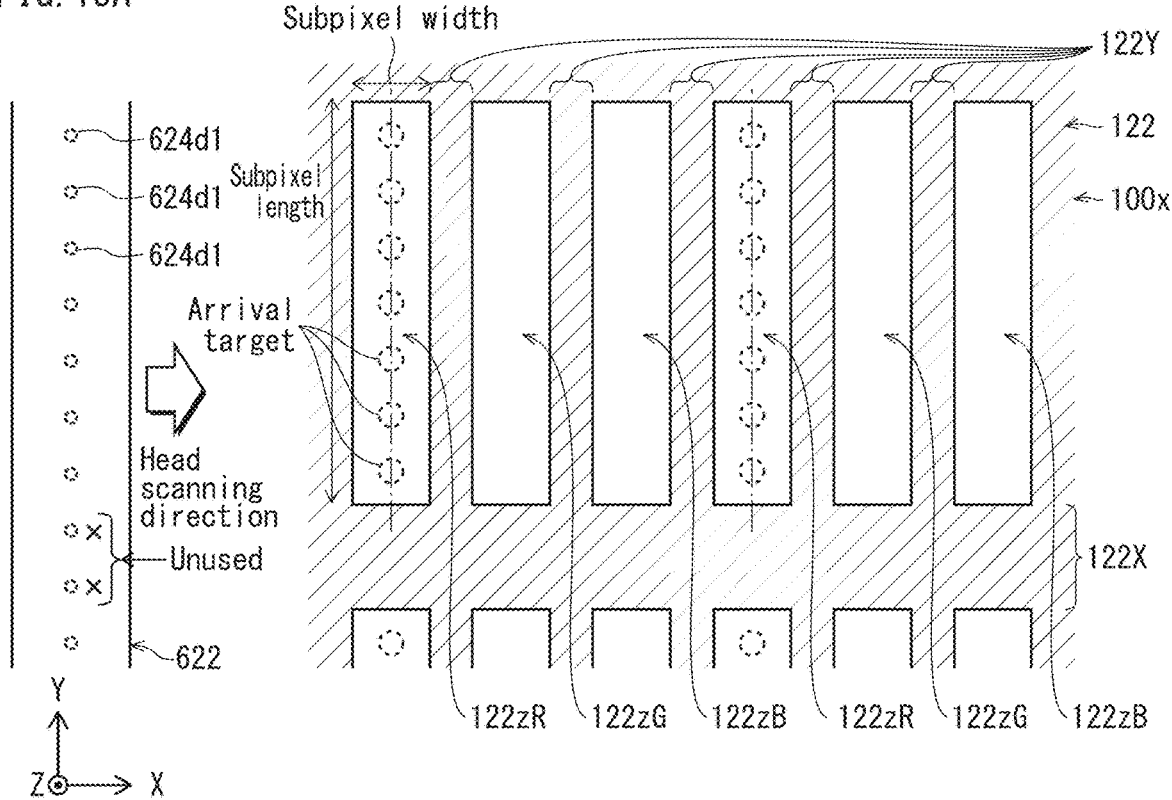
FIGS. 15A and 15B are views of an ink application process for light emitting layer formation to substrates in the organic EL display panel 10 during manufacture relating to at least one aspect, where
Figure 15B:
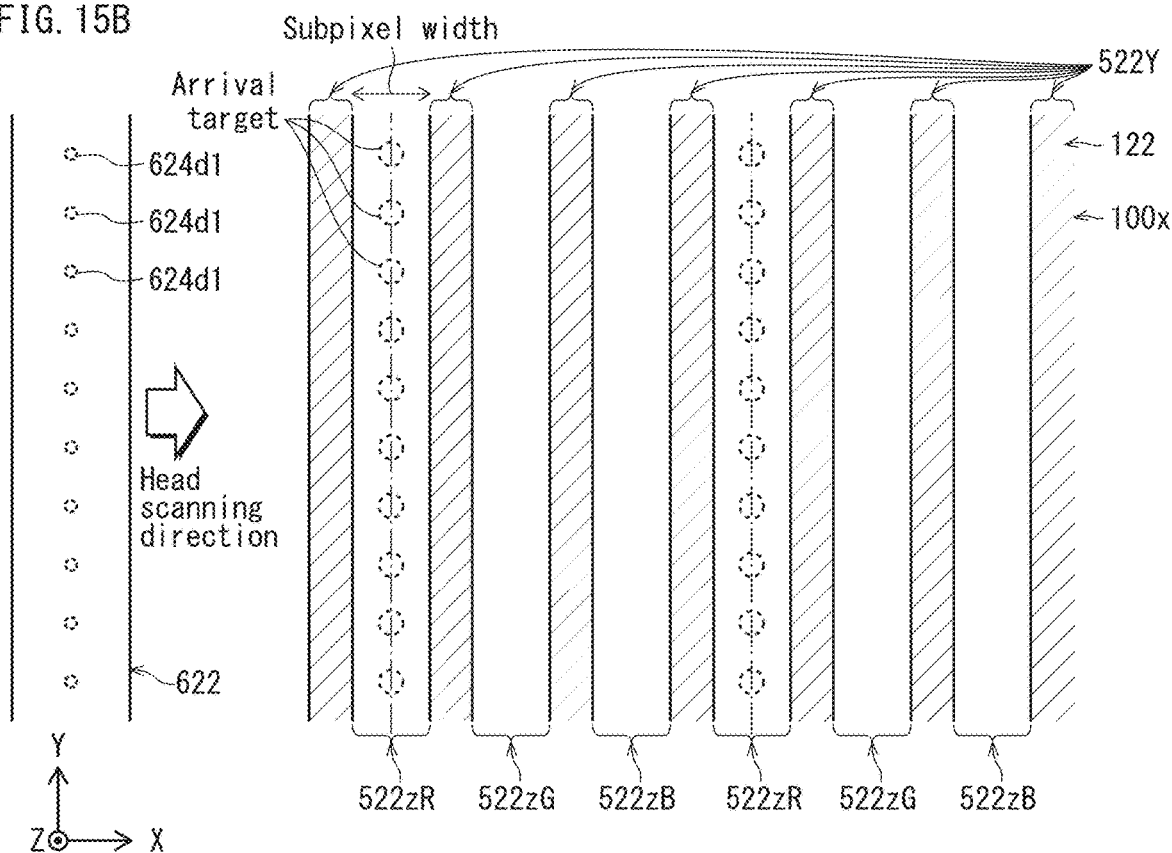

The following describes a process of forming the light emitting layers 123 with the ink jet method for mass production. FIGS. 15A and 15B are views of an ink application process for light emitting layer formation to substrates. Specifically, FIG. 15A shows a case where the inks are applied to regions of a lattice shape defined by the insulating sublayers 122X and 122Y, and FIG. 15B shows a case where the inks are uniformly applied to the gaps 522z between the column banks 522Y.

In formation of the light emitting layers 123, light emitting layers of the R, G, and B colors are formed in the regions defined by the banks arranged in lines, with use of three color inks, namely, the red ink 123RI, the green ink 123GI, and the blue ink 123BI, which are solutions for forming the light emitting layers 123.

For the purpose of simplifying the description, the three color inks are applied in order by the following application method. First, one of the inks is applied over the substrates. Then, another one of the inks is applied over the substrates. Lastly, the last one of the inks is applied over the substrates.

The following describes an application process of one of the three-color inks, namely, the red ink onto substrates as a representative.

[Ink Application to Regions of Lattice Shape Defined by Insulating Sublayers 122X and 122Y]

The ink is applied to the regions of a lattice shape defined by the insulating sublayers 122X and 122Y

According to this application method, in FIG. 15A, the substrate 100x is placed such that the longitudinal direction and the width direction of the subpixels 100se respectively coincide with the Y-direction and the X-direction. The ink discharge device performs ink application by, while scanning in the X direction with use of the ink jet head 622, discharging ink from the discharge ports 624d1 toward arrival targets that are set in the regions of a lattice shape which are defined by the insulating sublayers 122X and 122Y In FIG. 15A, the red subpixels 100se include arrival target positions onto which the red ink is to be applied.

Note that, among the discharge ports 624d1 of the ink jet head 622, only discharge ports 624d1, which pass above regions between each two adjacent insulating sublayers 122X, are used. Meanwhile, discharge ports 624d1 (indicated by sign × in FIG. 15A, which pass above the insulating sublayers 122X, are always unused. According to the example shown in FIG. 15A, seven arrival targets are set in each of the regions of the subpixel, and ink droplets are discharged from seven discharge ports 624d1.

After application of the one of the three color inks over the substrate 100x completes, application of another one of the inks is performed over the same substrate 100x, and lastly application of the last one of the inks is performed above the same substrate 100x. This application process of the three color inks is repeatedly performed for each of the substrates 100x.

Alternatively, the three color inks may be applied in order in the following manner. Specifically, when application of one of the inks above all of the substrates 100x is complete, the application process may be repeatedly performed to apply another one of the inks onto the substrates 100x, and then apply the other ink onto the substrate 100x.

[Uniform Ink Application to Gaps 522z Between Column Banks 522Y]

The light emitting layers 123 may be located not only above the luminous regions 100a but also above the non-luminous region 100b, which are located between the luminous regions 100a. In other words, the light emitting layers 123 may continuously extend over the luminous regions 100a and the non-luminous region 100b. With this configuration, when forming the light emitting layers 123, an ink applied to the luminous regions 100a can flow in the column direction via an ink applied to the non-luminous regions 100b. This results in uniform film thickness between the pixels in the column direction. Note that the insulating sublayers 122X approximately suppress the ink flow in the non-luminous regions 100b. Thus, a large degree of non-uniformity in film thickness is unlikely to occur in the column direction, and this improves luminance evenness between pixels.

According to this application method, in FIG. 15B, the substrate 100x is placed on a work table of the ink discharge device such that the column banks 522Y are arranged in the Y direction. The ink discharge device performs ink application by, while scanning in the X direction with use of an ink jet head 622 having discharge ports 624d1 arranged in line in the Y direction, discharging ink from the discharge ports 624d1 toward arrival targets that are set in the gaps 522z between the column banks 522Y All the discharge ports 624d1 of the ink jet head 622 are used in this application method. This is the difference from the above application method for lattice-shaped regions.

Note that the red ink is applied to one of each three regions that are adjacent to each other in the X-direction.

After application of the one of the three color inks to the substrate 100x is complete, another one of the three color inks is applied to the substrate 100x. Lastly, the last one of the three color inks is applied to the substrate 100x. In this way, the three color inks are applied in order.

(7) Formation of Electron Transport Layer 124, Counter Electrode Layer 125, and Sealing Layer 126

Figure 13D:
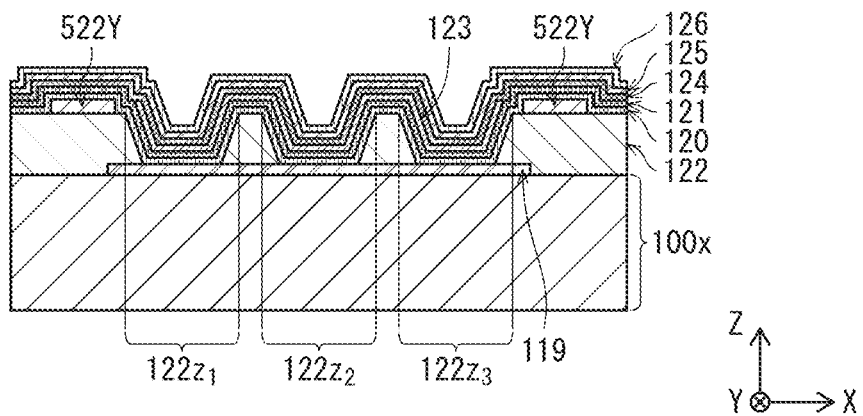

An electron transport layer 124 is formed with the sputtering method or the like. Then, a counter electrode layer 125 and a sealing layer 126 are formed in this order so as to cover the electron transport layer 124 (FIGS. 10C and 13D). The counter electrode layer 125 and the sealing layer 126 are formed with the CVD method, the sputtering method, or the like.

(8) Formation of CF Substrate 131

The following exemplifies a process of manufacturing a CF substrate 131 with reference to the figures. FIGS. 16A-16F are schematic cross-sectional views of the organic EL display panel 10 during manufacture, showing manufacturing of the CF substrate 131.

Figure 16A:
FIGS. 16A to 16F are schematic cross-sectional views of the organic EL display panel 10 during manufacture relating to at least one aspect, showing manufacturing of the CF substrate 131.

A light shielding layer paste 129R is prepared by dispersing in a solvent a material of a light shielding layer 129 mainly containing ultraviolet curable resin (for example, ultraviolet curable acrylic resin). The light shielding layer paste 129R is applied onto one of surfaces of a transparent upper substrate 130 (FIG. 16A).

Figure 16B:
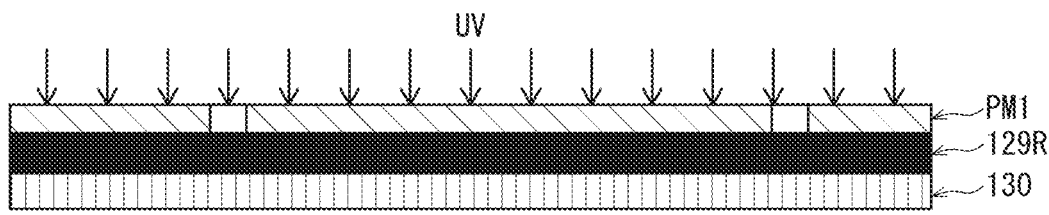

The applied light shielding layer paste 129R is dried and the solvent is vaporized to a certain degree. Then, a pattern mask PM1 having predetermined openings is overlaid above the light shielding layer paste 129R, and ultraviolet irradiation is performed on the pattern mask PM1 (FIG. 16B).

Figure 16C:
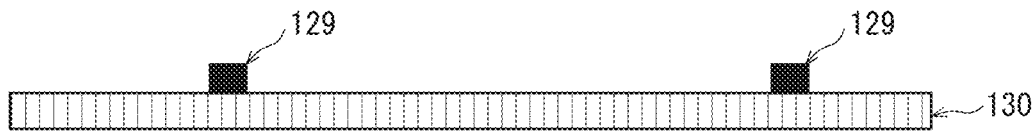

Then, the light shielding layer paste 129R, which has been applied and from which the solvent has been removed, is fired, and development is performed for removing the pattern mask PM1 and uncured parts of the light shielding layer paste 129R. Then, the light shielding layer paste 129R is cured. As a result, the light shielding layer 129 having a rectangular cross-section is complete (FIG. 16C).

Next, a paste 128R is prepared by dispersing in a solvent a material of color filter layers 128 (for example, color filter layers 128G,) mainly containing an ultraviolet curable resin component. The paste 128R is applied onto the surface of the upper substrate 130 on which the light shielding layer 129 is formed. The solvent is removed to a certain degree, and then a predetermined pattern mask PM2 is overlaid above the paste 128R and ultraviolet irradiation is performed on the pattern mask PM2 (FIG. 16D).

Then, development is performed for removing the pattern mask PM2 and uncured parts of the paste 128R, and the paste 128R is cured. As a result, the color filter layers 128G are complete (FIG. 16E).

Figure 16D:
Figure 16E:
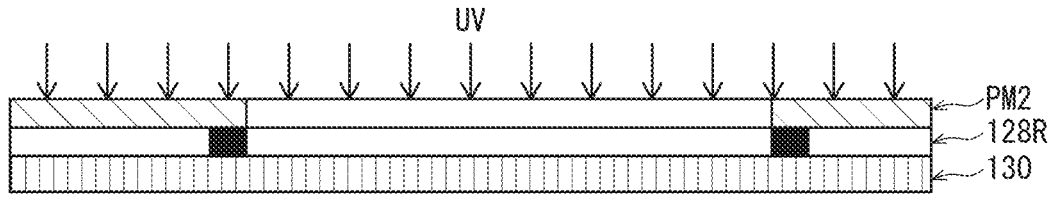
Figure 16F:
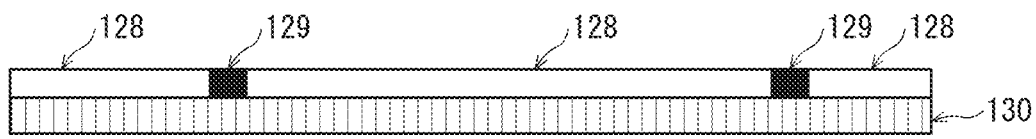

Color filter layers 128R and 128B are also formed by similarly repeating the processes in FIGS. 16D and 16E on color filter materials of the R and B colors. Note that any commercially available color filter products may be used instead of using the paste 128R.

This completes the CF substrate 131.

(9) Bonding of CF Substrate 131 and Rear Panel

Figure 11A:
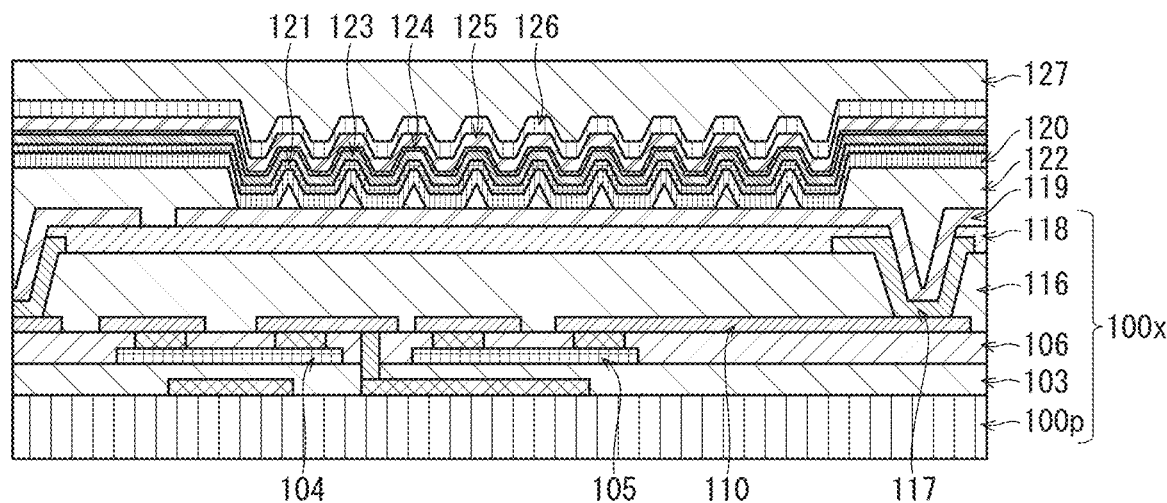
FIGS. 11A and 11B are schematic cross-sectional views of the organic EL display panel 10 during manufacture relating to at least one aspect, taken along the line at the same position as the line A-A in FIG. 4B, where
Figure 11B:
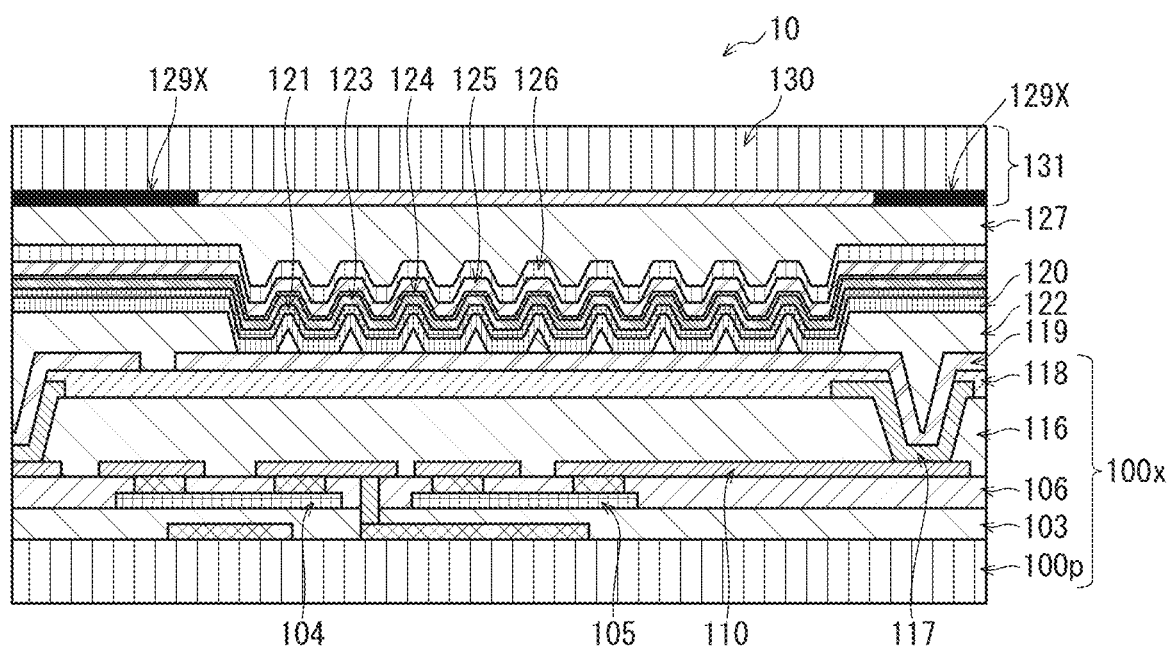
Figure 14A:
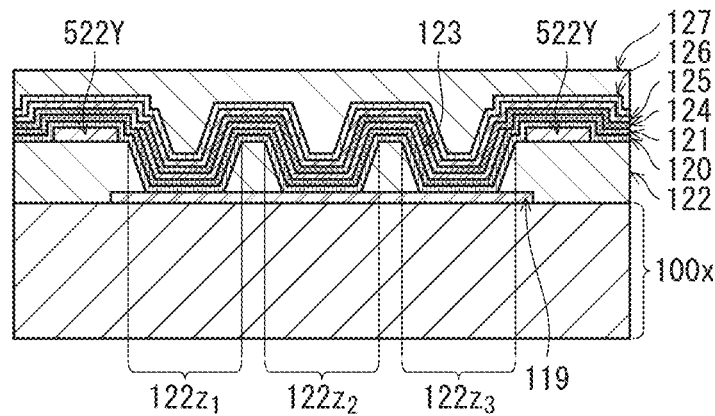
FIGS. 14A and 14B are schematic cross-sectional views of the organic EL display panel 10 during manufacture relating to at least one aspect, taken along the line at the same position as the line B-B in FIG. 4B, where
Figure 14B:
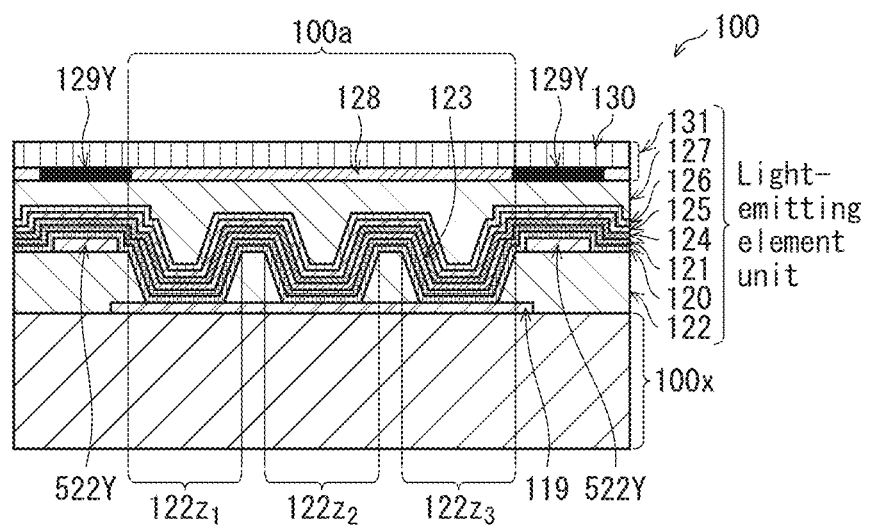

The following describes a bonding process of the CF substrate 131 and a rear panel in manufacturing the display panel 10. FIGS. 11A and 11B are schematic cross-sectional views taken along a line at the same position as the line A-A in FIG. 4B. FIGS. 14A and 14B are schematic cross-sectional views taken along a line at the same position as the line B-B in FIG. 4B.

First, a material of a bond layer 127 mainly containing light-transmissive ultraviolet curable resin is applied onto the rear panel, which is composed of the substrate 100x and the layers ranging from the pixel electrode layers 119 to the sealing layer 126 (FIGS. 11A and 14A). The light-transmissive ultraviolet curable resin is for example acrylic resin, silicone resin, or epoxy resin.

Subsequently, ultraviolet irradiation is performed on the applied material such that the CF substrate 131 and the rear panel are bonded to each other while positions relative to each other are maintained. At this time, intrusion of gas therebetween needs to be prevented. Then, the CF substrate 131 and the rear panel are fired. This completes a sealing process, and the organic EL display panel 10 is complete (FIGS. 11B and 14B).

6. Reflector Shape in Display Panel 10

(1) Relationship Between Reflector Shape and Ink Spread

The following describes a relationship between the reflector shape relating to the embodiment and the spread of ink for functional layer formation with reference to FIGS. 17A to 17E.

FIG. 17A is a cross-sectional view of the insulating layer 122 in one subpixel 100se taken along a surface perpendicular to the Y-axis, and FIG. 17B is a cross-sectional view of the insulating layer 122 in the subpixel 100se taken along a surface perpendicular to the X-axis. Also, FIG. 17C is a cross-sectional view of the insulating layer 122 in the subpixel 100se taken along a surface perpendicular to the Z-axis, specifically, along a line at the same position as a line C-C in FIGS. 17A and 17B. Similarly, FIG. 17D is a cross-sectional view of the insulating layer 122 in the subpixel 100se taken along the surface perpendicular to the Z-axis, specifically, taken along a line at the same position as a line D-D in FIGS. 17A and 17B. FIG. 17E is a cross-sectional view of the insulating layer 122 in the subpixel 100se taken along the surface perpendicular to the Z-axis, specifically, taken along a line at the same position as a line E-E in FIGS. 17A and 17B.

As described above, the openings 122zxy are truncated cones. Further, in FIGS. 17A and 17C to 17E, the openings 122zxy adjacent to each other in the row direction are separated from each other both in the upper surface and the lower surface of the insulating layer 122. Specifically, in FIGS. 17A and 17E, the openings 122zxy are arranged at predetermined intervals a in the row direction in the lower surface of the insulating layer 122. Further, in FIGS. 17A, 17C, and 17D, portions of the insulating layer 122, which partition between the openings 122zxy adjacent to each other in the row direction, have a height $h_1$ that is equal to the thickness of the insulating layer 122.

Meanwhile, in FIG. 17B, the openings 122zxy adjacent to each other in the column direction are separated from each other in the lower surface of the insulating layer 122, but are not separated from each other in the upper surface of the insulating layer 122. Specifically, in FIGS. 17B and 17E, the openings 122zxy are arranged at predetermined intervals b in the column direction in the lower surface of the insulating layer 122. The intervals b are shorter than the intervals a. Here, in FIGS. 17B to 17D, portions of the insulating layer 122, which partition between the openings 122zxy in the column direction, have a height $h_2$ that is lower than the thickness $h_1$ of the insulating layer 122. Further, in FIGS. 17C to 17E, the openings 122zxy adjacent to each other in the column direction are separated from each other at a height lower than the height $h_2$, but are communicated with each other at a height in a range of the height $h_2$ to the height $h_1$.

As described above, in the insulating layer 122 relating to the embodiment, at the height lower than the height $h_2$, the openings 122zxy adjacent to each other in the row direction are separated from each other, and the openings 122zxy adjacent to each other in the column direction are also separated from each other. Meanwhile, at the height in the range of the height $h_2$ to the height $h_1$, the openings 122zxy adjacent to each other in the row direction are separated from each other, but the openings 122zxy adjacent to each other in the column direction are communicated with each other. In other words, when applying an ink containing functional layer materials, the ink can flow in the column direction while an ink surface is higher than the height $h_1$. Thus, compared with the configuration in FIG. 20B, it is possible to suppress an insufficient ink spread in the column direction, nonuniformity in ink amount between the openings, and the like.

Note that the height $h_2$ should preferably be approximately 75% or less of the height $h_1$ in FIG. 18. The graph in FIG. 18 relates to the case where the lower width of the openings 122zxy is 4.5 μm and the height $h_1$ of the insulating layer 122 is 6.2 μm. Here, the height $h_2$ should preferably be 4.6 μm or lower. This configuration enables the ink to flow in the column direction to suppress an insufficient ink spread. Here, as shown below, it is possible to set the height $h_2$ to be approximately 75% or less of the height $h_1$ by setting the intervals b to be shorter than 0.65 times the lower width of the openings 122zxy. Specifically, this configuration can be easily achieved by setting the intervals b to 2.0 μm for the lower width of 4.5 μm.

(2) Relationship Between Reflector Shape and Light Extraction Efficiency

The openings 122zxy of the insulating layer 122 relating to the embodiment are separated from each other at the height lower than the height $h_2$. In other words, the reflectors are formed all around the openings 122zxy at the height lower than the height $h_2$. Also, at the height in the range of the height $h_2$ to the height $h_1$, the openings 122zxy adjacent to each other in the column direction are communicated with each other, but the openings 122zxy adjacent to each other in row direction are separated from each other. In other words, at the height in the range of the height $h_2$ to the height $h_1$, the reflectors are formed mainly at side surfaces in row direction of the openings 122zxy. According the display panel 10 relating to the embodiment, thus, a high area ratio of the reflectors to the luminous regions is high and accordingly the high light extraction efficiency is high, compared with the configuration in FIG. 20A.

Note that as the height $h_2$ increases, the area ratio of the reflectors to the luminous regions increases. Meanwhile, as the height $h_2$ decreases, the ink spread is improved as described above. In view of these, the height $h_2$ should preferably not be excessively low. In particular, to exhibit a high light extraction efficiency by the reflectors, the height $h_2$ should preferably be 20% or more of the height $h_1$.

(3) Manufacturing Method of Insulating Layer 122

As described above, the insulating layer 122 is manufactured by: forming a photosensitive film 122R made of metal oxide and metal nitride with the CVD method; drying the photosensitive film 122R and vaporizing a solvent thereof to a certain degree; overlaying a photomask PM having predetermined openings above the photosensitive film 122R, and performing ultraviolet irradiation on the photomask PM thereby to transfer patterns of the photomask PM to a photoresist made of photosensitive material; performing development on the photoresist; and patterning the photoresist by reactive ion etching.

In the case where the photosensitive film 122R is positive for example, exposure is performed on the photoresist film 122R by using a mask having light-transmissive parts corresponding to openings, specifically, a mask having the same shape as the lower surface of the insulating layer 122 in FIG. 17C. As a result of this exposure, parts of the photosensitive film 122R that correspond to lower surfaces of the openings have opening patterns having the same shape as the mask. Also, parts of the photosensitive film 122R that correspond to upper regions of the openings are complete through exposure on a larger area of the photoresist film 122R than the light-transmissive parts of the mask. This is due to edge exposure caused by diffraction at the interface between the light-transmissive parts and light-shielding parts of the mask. Here, the openings are adjacent to each other in the column direction at short intervals, and accordingly upper parts of the insulating layer 122 corresponding to parts directly below the light-shielding parts of the mask are removed due to the edge exposure. Thus, as a result of development and patterning by reactive ion etching, parts of the insulating layer 122 that partition between adjacent openings have a tapered shape with a width that decreases upward and is shorter than the width of corresponding light-shielding parts each arranged between adjacent light-transmissive parts. Also, in the case where the light-shielding parts, which are each arranged between adjacent light-transmissive parts, are smaller in size than a predetermined value, the upper parts of the insulating layer 122, which partition between adjacent openings and correspond to the parts directly below the light-shielding parts of the mask, are removed due to the edge exposure, and thus parts of the insulating layer 122 after removal of the upper parts is short in height, as described above. As a result, the insulating layer 122 has portions partitioning between the openings adjacent to each other in the column direction and having the height $h_2$ that is lower than the height $h_1$.

Although the above description is given on the case where the photosensitive film 122R is positive, the same applies to negative ones. Also, in the case where, instead of using photoresist for the material of the insulating layer 122, the insulating layer 122 is formed by forming a photoresist layer on the insulating layer 122 and then patterning and etching the insulating layer 122, the above configuration of the insulating layer 122 is achieved by performing an etching process of forming the lower surface of the insulating layer 122 so as to have the same shape as patterns and etching the upper surface of the insulating layer 122 so as to be larger than the patterns (so-called overetching).

(4) Summary of at Least One Embodiment

As described above, according to the reflector shape relating to the embodiment, the portions of the insulating layer 122, which partition between the openings adjacent to each other in the column direction in one pixel, are low in terms of height. This configuration improves the ink spread to suppress nonuniformity in film thickness especially for application-type functional layers. Thus, it is possible to suppress generation of non-luminous micropixels, thereby suppressing nonuniformity in electrical properties between micropixels. In other words, it is possible to achieve organic EL elements with a high efficiency and a prolonged service life. Also, according to the reflector shape relating to the embodiment, the reflectors each surrounding one opening are provided both in the column direction and the row direction. Accordingly, compared with elongated openings extending in the column direction, the area ratio of the reflectors to the luminous regions is high and thus the light extraction efficiency is high.

Further, the reflector shape relating to the embodiment can be easily achieved using the photolithography method, and cost reduction for the reflectors is possible.

7. Other Opening Shapes

The reflector shape relating to the embodiment is configured from the openings 122zxy which are arranged in a matrix. Alternatively, the reflector shape may be for example as follows.

Figure 19A:
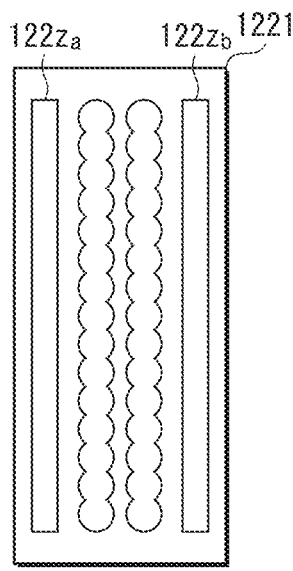
FIGS. 19A and 19B are schematic cross-sectional views of an insulating layer relating to at least one aspect.
Figure 19B:
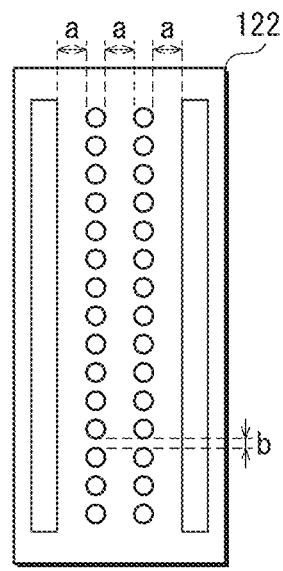

For example, reflectors may be configured from an opening line and an elongated opening that are arranged in the row direction in plan view. The opening line is constituted from truncated conical openings that are arranged in the column direction, and upper portions of the adjacent truncated conical openings are communicated with each other. The elongated opening extends in the column direction. Arrangement of the openings may be for example as follows: an elongated opening extending in the column direction is provided on each of both sides of a periphery of truncated conical openings, which are arranged in a matrix, in the row direction such that the insulating layer has an upper surface in FIG. 19A and a lower surface in FIG. 19B. Here, in the lower surface of the insulating layer, the distance b between the truncated conical openings adjacent to each other in the column direction is shorter than the distance a between the openings adjacent to each other in the row direction.

Figure 19C:
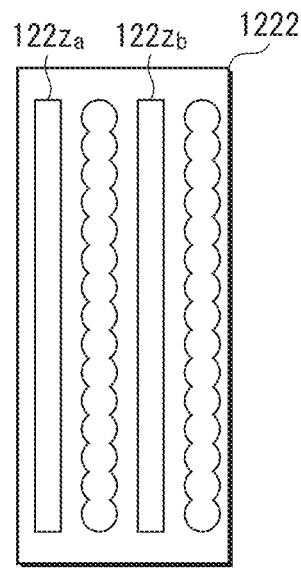
FIG. 19C is a schematic cross-sectional view of an insulating layer relating to at least one aspect, where

Alternatively, for example in FIG. 19C, the reflectors may be configured from opening lines and elongated openings alternating in the row direction. The opening lines are each constituted from truncated conical openings that are arranged in the column direction, and upper portions of the adjacent truncated conical openings are communicated with each other. The elongated openings extend in the column direction.

It is possible to improve the flow of the ink containing functional layer materials in the column direction owing to the configurations such as described above in which the opening lines, each of which are constituted from truncated conical openings which are arranged in the column direction so as to have upper portions communicated with each other, and the elongated openings, which extend in the column direction, are arranged in the row direction. Further, compared with the configuration in FIG. 20A, it is possible to improve the light extraction efficiency by providing the opening lines, which are each constituted from truncated conical openings which are arranged in the column direction so as to have upper portions communicated with each other.

Note that the opening arrangement is not limited to the above ones, and the openings may be arranged in any arrangement in which opening lines, each of which are constituted from truncated conical openings that are arranged in the column direction so as to have upper portions communicated with each other, and elongated openings, which extend in the column direction, are arranged in the row direction.

<<Other Modifications>>

In the above embodiment, the display panel 10 is described. However, the present disclosure is not limited to the above embodiment except the essential characteristic compositional elements thereof. For example, the present disclosure also includes an embodiment obtained through various types of modifications which could be conceived of by one skilled in the art to the above embodiment, an embodiment obtained through any combination of the compositional elements and the functions in the above embodiment without departing from the spirit of the present invention, and so on. The following describes modifications of the display panel 10 as examples of such an embodiment.

(1) In the display panel 10 relating to the embodiment, the openings 122zxy are truncated cones whose width decreases downward. However, the openings 122zxy only need to have a width decreasing downward. The openings 122zxy may have a shape configured by extending truncated cones in the column direction or the row direction. Also, the upper surfaces and the lower surfaces of the openings 122zxy are not limited to be circular. Alternatively, the upper and lower surfaces of the openings 122zxy may be tetragonal, hexagonal, octagonal, or the like (that is, the openings 122zxy may be prismoids), but should preferably be circular or regular polygonal. This is because the upper and lower surfaces of the openings 122zxy should preferably be isotropic.

In the display panel 10 relating to the embodiment, the portions of the insulating layer 122, which partition between the openings 122zxy adjacent to each other in the column direction, have the height $h_2$ which is lower than the thickness $h_1$ of the insulating layer 122. However, part of the portions of the insulating layer 122, which partition between the openings 122zxy adjacent to each other in the column direction, only needs to have the height $h_2$ which is lower than the thickness $h_1$ of the insulating layer 122. That is, a remainder of the portions of the insulating layer 122, which partition between the openings 122zxy adjacent to each other in the column direction, may have a height that is equal to or higher than the height $h_2$ and equal to or lower than the thickness $h_1$. Note that the height $h_2$ should preferably be 20% or more of the thickness $h_1$.

(2) In the display panel 10 relating to the embodiment, the CF substrate 131, on which the light shielding sublayers 129X and 129Y are provided, is bonded via the bond layer 127 onto the rear panel, which is composed of the substrate 100X and the layers ranging from the pixel electrode layers 119 to the sealing layer 126. Alternatively, in the exemplified display panel 10, the light shielding sublayers 129X and 129Y may be directly provided on the rear panel.

(3) In the display panel 10, the light emitting layers 123 are continuous in the column direction above the row banks. Alternatively, the light emitting layers 123 may not be continuous for the entire pixels above the row banks.

(4) In the display panel 10, the light emitting layers 123 of the subpixels 100se, which are arranged in the gaps 522z between the column banks 522Y adjacent to each other in the row direction, each emit light of a color different from adjacent one. Meanwhile, the light emitting layers 123 of the subpixels 100se, which are arranged in the gaps 522z between the row banks 522X adjacent to each other in the column direction, emit light of the same color. Alternatively, the light emitting layers 123 of the subpixels 100se, which are adjacent to each other in the row direction, may emit light of the same color, and the light emitting layers 123 of the subpixels 100se, which are adjacent to each other in the column direction, each may emit light of a color different from adjacent one. Further alternatively, the light emitting layers 123 of the subpixels 100se, which are adjacent in the row direction, each may emit light of a color different from adjacent one, and the light emitting layers 123 of the subpixels 100se, which are adjacent to each other in the column direction, each may emit light of a color different from adjacent one.

(5) In the display panel 10, the CF substrate 131 is bonded via the bond layer 127 onto the rear panel, which is composed of the substrate 100X and the layers ranging from the pixel electrode layers 119 to the sealing layer 126. In addition, a photo spacer may be inserted between the CF substrate 131 and the rear panel.

(6) In the display panels relating to the embodiment and the modifications, when the refractive indices of the bond layer 127 and the insulating layer 122 of the display panel 10 are represented by $n_1$ and $n_2$, respectively, the following relationships are satisfied: $1.1 \leq n_1 \leq 1.8$; and $|n_1-n_2| \geq 0.20$. Further, when the gradient of the slopes of the reflectors is represented by $\theta$, the following relationships are satisfied: $n_2 < n_1$; and $75.2-54(n_1-n_2) \leq \theta \leq 81.0-20(n_1-n_2)$. Alternatively, the four following relationships may be satisfied. Specifically, among the layers ranging from the insulating layer 122 to the bond layer 127, when a refractive index of a layer provided near the color filter layers 128 is represented by and $n_3$ and a refractive index of a layer provided near the pixel electrode layers 119 is represented by $n_4$, the following relationships may be satisfied: $1.1 \leq n_3 \leq 1.8$; and $|n_3-n_4| \geq 0.20$. Also, when the gradient of the slopes of reflectors is represented by $\theta$, the following relationships may be satisfied: $n_4 < n_3$; and $75.2-54(n_3-n_4) \leq \theta \leq 81.0-20(n_3-n_4)$.

(7) Others

The display panel 10 relating to the above embodiment includes the subpixels 100se of the three colors of red, green, and blue. However, the present disclosure is not limited to this. For example, light emitting layers of a single color and subpixels of the single color may be employed. Alternatively, light emitting layers of four colors of red, green, blue, and yellow and subpixels of the four colors may be employed. Further alternatively, subpixels of a single color may have light emitting layers of two or more colors. For example, subpixels emitting yellow light may have red light emitting layers and green light emitting layers. Yet alternatively, subpixels and light emitting layers may be achieved by combining the light emitting layers with color filters, where the subpixels are larger in number of color type than the light emitting layers. For example, red, green, and blue pixels may be achieved respectively by combining white light emitting layers with red, green, and blue light-transmissive filters. Furthermore, the unit pixel 100e does not necessarily need to be composed of subpixels 100se. For example, the unit pixel 100e may be composed of a single subpixel 100se with the same configuration as the unit pixel 100e relating to the embodiment.

Also, the unit pixels 100e and the subpixels 100se, which constitute the unit pixels 100e, are arranged in a matrix in the above embodiment. However, the present disclosure is not limited to this. In the case for example where an interval of the pixel region is one pitch, the pixel region may be shifted in the column direction by half pitch between adjacent gaps.

Also, the display panel 10 includes the pixel electrode layers 119 each of which are provided between every two of all the gaps 522z. However, the present disclosure is not limited to this. For example, some of the gaps 522z may not have the pixel electrode layer 119 therebetween in order to form a bus bar or the like.

Moreover, the display panel 10 includes the color filter layers 128 that are provided above the gaps 522z corresponding to the subpixels 100se of the R, G, and B colors. Alternatively, the exemplified display panel 10 may have a configuration in which the color filter layers 128 are not provided above the gaps 522z.

Also, in the above embodiment, the hole injection layer 120, the hole transport layer 121, the light emitting layers 123, and the electron transport layer 124 are provided between each of the pixel electrode layers 119 and the counter electrode layer 125. However, the present disclosure is not limited to this. For example, only the light emitting layers 123 may be provided between each of the pixel electrode layers 119 and the counter electrode layer 125, without providing the hole injection layer 120, the hole transport layer 121, and the electron transport layer 124. Alternatively, a hole injection layer, a hole transport layer, an electron transport layer, an electron injection layer, and so on may be included, or some or all of these layers may be simultaneously included, for example. Moreover, all of these layers do not need to be made of organic compound, and alternatively some of the layers may be made of inorganic substance or the like. Furthermore, the hole injection layer 120, the hole transport layer 121, and the electron transport layer 124 may be formed using a dry deposition method such as the vacuum deposition method, an electron beam deposition method, the sputtering method, a reactive sputtering method, an ion plating method, and a chemical vapor deposition method. Also, in the case where the hole injection layer 120 and the hole transport layer 121 are formed using the dry deposition method, the pixel electrode layers 119, the hole injection layer 120, the hole transport layer 121, the insulating layer 122, and the light emitting layers 123 may be layered in this order.

Also, in the above embodiment, the pixel electrode layers 119 as anodes are provided in the lower part of the organic EL element unit so as to be connected with the source electrodes of the TFTs. Alternatively, the counter electrode layer and the anodes may be provided respectively in the lower part and the upper part of the organic EL element unit. In this case, the cathode that is provided in the lower part is connected with the drain electrodes of the TFTs.

Also, the two transistors $Tr_1$ and $Tr_2$ are provided for each subpixel 100se in the above embodiment. However, the present disclosure is not limited to this. For example, one transistor may be provided for each subpixel, or three or more transistors may be provided for each subpixel.

Furthermore, an EL display panel of the top-emission type is exemplified in the above embodiment. However, the present disclosure is not limited to this. For example, the present disclosure may be applied to a display panel of a bottom-emission type. In this case, the configurations of the components may be appropriately modified.

Also, in the above embodiment, the display panel 10 is an active-matrix display panel. However, the present disclosure is not limited to this. For example, the display panel 10 may be a passive-matrix display panel. Specifically, pairs of a linear electrode, which is parallel to the column direction, and a linear electrode, which is parallel to the row direction, may be provided such that each pair of the electrodes sandwich the light emitting layer 123 therebetween. In this case, the configurations of the components may be appropriately modified. Although the substrate 100x in the above embodiment includes the TFT layer, the substrate 100x does not necessarily need to include the TFT layer as seen in the above example of the passive-matrix display panel.

<<Supplements>>

The embodiment described above shows a specific preferred example of the present disclosure. The numerical values, the shapes, the materials, the components, the arrangement and connection status of the components, the processes, the order of the processes, and so on described in the above embodiment are just examples, and do not intend to limit the present disclosure. Also, processes among the components in the embodiment, which are not described in the independent claims representing the most generic concept of the present disclosure, are explained as arbitrary components of a more preferred embodiment.

Furthermore, the order of performing the above processes is exemplification for specifically describing the present disclosure, and the processes may be performed in an order different from the above one. Moreover, part of the above processes may be performed simultaneously (in parallel) with other process.

Also, the components shown in the figures in the above embodiment are not necessarily drawn to scale for easy understanding of the present disclosure. Furthermore, the present disclosure is not limited by the description of the above embodiment, and may be appropriately modified without departing from the scope of the present invention.

Moreover, at least part of the functions of the above embodiment and modifications may be combined with each other.

Furthermore, the present disclosure also includes embodiments obtained through various types of modifications that could be conceived of by one skilled in the art to the above embodiment.

Although the technology pertaining to the present disclosure has been fully described by way of examples with reference to the accompanying drawings, it is to be noted that various changes and modifications will be apparent to those skilled in the art. Therefore unless such changes and modifications depart from the scope of the present disclosure, they should be construed as being included therein.

The invention claimed is:

1. An organic electroluminescence (EL) display panel including pixels arranged in a matrix of rows and columns, the organic EL display panel comprising:
a substrate;
pixel electrodes that are arranged above the substrate in the matrix;
an insulating layer that is provided above the pixel electrodes and has a plurality of openings for each of the pixel electrodes;
banks that extend in a column direction and partition between the pixel electrodes in a row direction;
organic functional layers that are provided above the pixel electrodes and include organic light emitting layers in which organic electroluminescence occurs in the plurality of openings; and
a light-transmissive counter electrode that is provided above the organic functional layers, wherein
the plurality of openings include first openings and a second opening,
the first openings are arranged in line in the column direction to form a first opening line, and the second opening is adjacent to one of the first openings in the row direction, and
portions of the insulating layer between the first openings adjacent to each other in the column direction are lower in terms of height relative to the pixel electrode than a portion of the insulating layer between the one first opening and the second opening.

2. The organic EL display panel of claim 1, wherein the plurality of openings each have a width increasing toward the counter electrode and have a slope toward a periphery of the pixel.

3. The organic EL display panel of claim 1, wherein the portions of the insulating layer between the first openings adjacent to each other in the column direction are 75% or less of the portion of the insulating layer between the one first opening and the second opening in terms of the height relative to the pixel electrode.

4. The organic EL display panel of claim 1, wherein the portion of the insulating layer between the one first opening and the second opening has a height of 6 μm or more relative to the pixel electrode.

5. The organic EL display panel of claim 1, wherein the second opening is plural in number, and the second openings are arranged in line in the column direction to form a second opening line that is adjacent to the first opening line in the row direction, and
in a lower surface of the insulating layer, a distance between the first openings adjacent to each other in the column direction is shorter than a distance between the first opening line and the second opening line.

6. The organic EL display panel of claim 5, wherein in the lower surface of the insulating layer, the distance between the first openings adjacent to each other in the column direction is shorter than 0.65 times a width of each of the first openings in the column direction.

7. The organic EL display panel of claim 5, wherein the first openings are each a truncated cone whose diameter decreases toward the pixel electrode.

8. The organic EL display panel of claim 1, wherein the second opening is elongated and extends in the column direction.

9. An organic electroluminescence (EL) display device comprising an organic EL display panel that includes pixels arranged in a matrix of rows and columns, wherein
the organic EL display panel comprises:
a substrate;
pixel electrodes that are arranged above the substrate in the matrix;
an insulating layer that is provided above the pixel electrodes and has a plurality of openings for each of the pixel electrodes;
banks that extend in a column direction and partition between the pixel electrodes in a row direction;
organic functional layers that are provided above the pixel electrodes and include organic light emitting layers in which organic electroluminescence occurs in the plurality of openings; and
a light-transmissive counter electrode that is provided above the organic functional layers, wherein
the plurality of openings include first openings and a second opening, the first openings are arranged in line in the column direction to form a first opening line, and the second opening is adjacent to one of the first openings in the row direction, and portions of the insulating layer between the first openings adjacent to each other in the column direction are lower in terms of height relative to the pixel electrode than a portion of the insulating layer between the one first opening and the second opening.

10. A method of manufacturing an organic electroluminescence (EL) display panel including pixels arranged in a matrix of rows and columns, the method comprising:

preparing a substrate;

forming pixel electrodes above the substrate in the matrix;

forming, above the pixel electrodes, an insulating layer having a plurality of openings for each of the pixel electrodes;

forming banks extending in a column direction and partitioning between the pixel electrodes in a row direction;

forming, in the plurality of openings, organic functional layers including organic light emitting layers by applying an ink while scanning at least one of the substrate and an application device in the row direction, the ink containing a material of the organic light emitting layers; and forming a light-transmissive counter electrode above the organic functional layers, wherein in the forming of the insulating layer, the plurality of openings including first openings and a second opening are provided in the insulating layer such that: the first openings are arranged in line in the column direction to form a first opening line; the second opening is adjacent to one of the first openings in the row direction; and portions of the insulating layer between the first openings adjacent to each other in the column direction are lower in terms of height relative to the pixel electrode than a portion of the insulating layer between the one first opening and the second opening.

* * * * *